(12) United States Patent
Gaikwad

(10) Patent No.: US 8,116,408 B2
(45) Date of Patent: Feb. 14, 2012

(54) GAIN CONTROL FOR REDUCED INTERFRAME SPACING (RIFS)

(75) Inventor: Rohit V. Gaikwad, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 851 days.

(21) Appl. No.: 12/213,179

(22) Filed: Jun. 16, 2008

(65) Prior Publication Data

US 2008/0310559 A1 Dec. 18, 2008

Related U.S. Application Data

(60) Provisional application No. 60/929,154, filed on Jun. 15, 2007, provisional application No. 60/929,155, filed on Jun. 15, 2007, provisional application No. 60/929,156, filed on Jun. 15, 2007, provisional application No. 60/960,706, filed on Oct. 10, 2007.

(51) Int. Cl.
*H04L 27/06* (2006.01)

(52) U.S. Cl. ........ 375/340; 375/260; 375/267; 375/316; 375/345; 375/349; 375/350; 342/101; 342/98; 342/89

(58) Field of Classification Search .................. 375/340, 375/260, 267, 316, 345, 349, 350; 342/101, 342/98, 89

See application file for complete search history.

(56) References Cited

U.S. PATENT DOCUMENTS

| 5,454,010 | A | 9/1995 | Leveque |
| 5,477,504 | A | 12/1995 | Hagerty |
| 5,740,526 | A | 4/1998 | Bonta et al. |
| 5,822,373 | A | * | 10/1998 | Addy ........................... 375/259 |
| 6,307,883 | B1 | 10/2001 | Kanada et al. |
| 6,587,513 | B1 | 7/2003 | Ichihara |
| 6,862,315 | B1 | 3/2005 | Garg et al. |
| 7,035,345 | B2 | 4/2006 | Jeckeln et al. |
| 7,161,987 | B2 | 1/2007 | Webster et al. |
| 7,177,374 | B2 | 2/2007 | Gaikwad et al. |
| 7,183,847 | B2 | 2/2007 | Suzuki et al. |
| 7,233,773 | B2 | 6/2007 | Hansen et al. |

(Continued)

OTHER PUBLICATIONS

Intensi-fi Product Brief: Draft-802.11n Product Family, Broadcom Corporation Intensi-fi-PB03-R, Jun. 27, 2008, 2 pages.

(Continued)

*Primary Examiner* — Siu Lee

(74) *Attorney, Agent, or Firm* — Sterne, Kessler, Goldstein & Fox P.L.L.C.

(57) ABSTRACT

A method and apparatus is disclosed to recover at least one information payload from a frame and/or to configure one or more reception parameters to receive a future frame to support RIFS. A physical layer device (PHY) receives at least a training sequence embedded in the frame of a transmitted communication signal using a receiver filter bandwidth corresponding to a variable filter training sequence bandwidth. The PHY determines an amount of gain necessary to recover an information payload embedded in the frame based on the recovery of the training sequence. The PHY determines an amount of gain necessary to recover an information payload embedded in the frame based on the recovery of the preamble. A previous communications receiver gain is adjusted by the difference between the amount of gain necessary to recover the information payload and the previous communications receiver gain. The PHY adjusts the receiver filter bandwidth from the variable filter training sequence bandwidth to a variable filter information payload bandwidth. The PHY recovers the at least one information payload embedded in frame using the variable filter information payload bandwidth. The PHY adjusts the receiver filter bandwidth from the information payload bandwidth to the variable filter training sequence bandwidth to receive the future frame.

27 Claims, 15 Drawing Sheets

U.S. PATENT DOCUMENTS

| | | | |
|---|---|---|---|
| 7,259,630 B2 | 8/2007 | Bachman et al. | |
| 7,269,430 B2 | 9/2007 | Moorti et al. | |
| 7,279,972 B2 | 10/2007 | Smithson | |
| 7,321,264 B2 | 1/2008 | Kokkeler | |
| 7,340,265 B2 | 3/2008 | Husted et al. | |
| 7,403,573 B2 | 7/2008 | DeBruyn et al. | |
| 7,414,470 B2 | 8/2008 | Okazaki | |
| 7,450,533 B2 | 11/2008 | Aoki et al. | |
| 7,480,234 B1 | 1/2009 | Hart et al. | |
| 7,483,802 B2 | 1/2009 | Wood | |
| 7,577,413 B2 | 8/2009 | He et al. | |
| 7,620,373 B2 | 11/2009 | Cole et al. | |
| 7,646,876 B2 | 1/2010 | Chu et al. | |
| 7,881,390 B2 | 2/2011 | Sadowsky et al. | |
| 7,881,402 B2 | 2/2011 | Gao et al. | |
| 2003/0203743 A1 | 10/2003 | Sugar et al. | |
| 2004/0121753 A1 | 6/2004 | Sugar et al. | |
| 2005/0064892 A1 | 3/2005 | Cavin | |
| 2005/0113120 A1 | 5/2005 | Rappaport et al. | |
| 2006/0084402 A1* | 4/2006 | Oshima et al. | 455/232.1 |
| 2006/0146869 A1 | 7/2006 | Zhang et al. | |
| 2006/0182168 A1 | 8/2006 | Wang et al. | |
| 2006/0198477 A1 | 9/2006 | Moorti et al. | |
| 2006/0223483 A1 | 10/2006 | Behazd | |
| 2006/0229029 A1 | 10/2006 | Waltho et al. | |
| 2006/0285478 A1 | 12/2006 | Gaikwad et al. | |
| 2007/0002878 A1 | 1/2007 | Moorti et al. | |
| 2007/0002981 A1 | 1/2007 | Gaikwad et al. | |
| 2007/0004372 A1 | 1/2007 | Adams et al. | |
| 2007/0019749 A1* | 1/2007 | Gaikwad et al. | 375/260 |
| 2007/0019750 A1 | 1/2007 | Gaikwad et al. | |
| 2007/0060162 A1 | 3/2007 | Xhafa et al. | |
| 2007/0064842 A1 | 3/2007 | Ross et al. | |
| 2007/0105587 A1 | 5/2007 | Lu | |
| 2007/0110197 A1 | 5/2007 | Bagchi et al. | |
| 2007/0202749 A1 | 8/2007 | Bhat et al. | |
| 2007/0224935 A1 | 9/2007 | Waxman | |
| 2008/0101495 A1 | 5/2008 | Gaikwad | |
| 2008/0101496 A1 | 5/2008 | Gaikwad | |
| 2008/0101497 A1 | 5/2008 | Gaikwad et al. | |
| 2008/0118013 A1 | 5/2008 | Vis et al. | |
| 2008/0139156 A1 | 6/2008 | Behzad et al. | |
| 2008/0309405 A1 | 12/2008 | Young | |
| 2008/0310336 A1 | 12/2008 | Gaikwad | |
| 2008/0310487 A1 | 12/2008 | Hammerschmidt | |
| 2008/0310557 A1 | 12/2008 | Gaikwad | |
| 2008/0310558 A1 | 12/2008 | Gaikwad | |
| 2010/0208852 A1 | 8/2010 | Feher | |

OTHER PUBLICATIONS

IEEE Standard 802.11 a-1999, Part 11, IEEE, 1999, pp. 1-90.
Office Action mailed on Apr. 5, 2011, in U.S. Appl. No. 12/213,176, inventor Gaikwad, filed Jun. 16, 2008; 13 pages.

* cited by examiner

GAIN CONTROL FOR REDUCED INTERFRAME SPACING (RIFS)

BACKGROUND OF THE INVENTION

The present application claims the benefit of: U.S. Provisional Patent Appl. No. 60/929,154, filed Jun. 15, 2007, U.S. Provisional Patent Appl. No. 60/929,155, filed Jun. 15, 2007, U.S. Provisional Patent Appl. No. 60/929,156, filed Jun. 15, 2007, and U.S. Provisional Patent Appl. No. 60/960,706, filed Oct. 10, 2007, each of which is incorporated by reference herein in its entirety.

The present application is related to: U.S. Provisional Patent Appl. No. 60/929,149, filed Jun. 15, 2007, U.S. Provisional Patent Appl. No. 60/960,384, filed Sep. 27, 2007 U.S. patent application Ser. No. 12/004,406, filed Dec. 21, 2007, U.S. patent application Ser. No. 12/213,172, filed Jun. 16, 2008, U.S. patent application Ser. No. 12/213,176, filed Jun. 16, 2008, and U.S. patent application Ser. No. 12/213,175, filed Jun. 16, 2008, each of which is incorporated by reference herein in its entirety.

FIELD OF THE INVENTION

The present invention relates generally to a communications receiver, more specifically to operation of the communications receiver to support a reduced interframe spacing (RIFS).

RELATED ART

A communication system typically involves transmitting an information signal as a communications signal from a communications transmitter to a communications receiver over a communication channel. The communications transmitter may include a single transmit antenna to produce a single stream communications signal or multiple transmit antennas to produce a multiple stream communications signal. The communications transmitter may transmit the single stream communications signal and/or the multiple stream communications signal as one or more frames.

A conventional communications receiver receives the single stream communications signal and/or the multiple stream communications signal as it passes through a communication channel. The conventional communications receiver may recover a first training sequence embedded in a first frame of the single stream communications signal and/or the multiple stream communications signal. After the conventional receiver recovers the first training sequence embedded in the first frame, the conventional communications receiver configures one or more conventional reception parameters to recover a first information payload embedded within the first frame.

However, if a duration of time between transmission of the first frame and the second frame, referred to as an interframe spacer, is insufficient, the communications transmitter may transmit the second frame before the conventional receiver recovers the first information payload and/or a second training sequence embedded in a second frame. As a result, the conventional receiver may not configure the one or more conventional reception parameters to recover a second information payload embedded within the second frame. For example, the conventional communications receiver is incapable of recovering the first information payload before the communications transmitter transmits the second frame to support reduced interframe spacing (RIFS). The conventional receiver may not configure the one or more conventional reception parameters to recover a second information payload embedded within the second frame to support RIFS.

Therefore, what is needed is a communications receiver that is capable of recovering the first information payload from the first frame and/or of configuring one or more reception parameters to recover a second information payload embedded within a second frame before transmission of the second frame by the communications transmitter to support RIFS.

BRIEF DESCRIPTION OF THE DRAWINGS/FIGURES

The accompanying drawings illustrate the present invention and, together with the description, further serve to explain the principles of the invention and to enable one skilled in the pertinent art to make and use the invention.

Figure 1A:
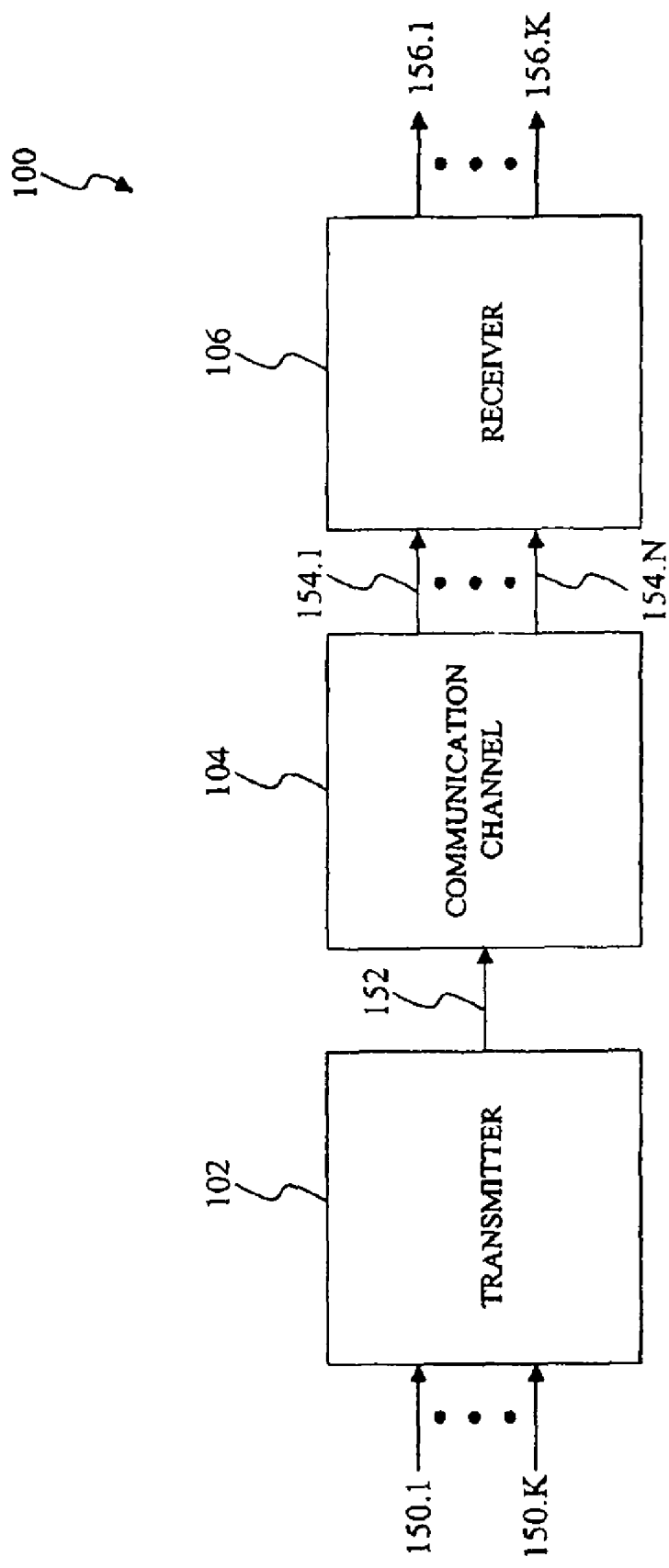
FIG. 1A illustrates a block diagram of a communication environment according to an exemplary embodiment of the present invention.

The present invention will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following detailed description of the present invention refers to the accompanying drawings that illustrate exemplary embodiments consistent with this invention. Other embodiments are possible, and modifications may be made to the embodiments within the spirit and scope of the invention. Therefore, the detailed description is not meant to limit the invention. Rather, the scope of the invention is defined by the appended claims.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein may be spatially arranged in any orientation or manner. Likewise, particular bit values of "0" or "1" (and representative voltage values) are used in illustrative examples provided herein to represent information for purposes of illustration only. Information described herein may be represented by either bit value (and by alternative voltage values), and embodiments described herein may be configured to operate on either bit value (and any representative voltage value), as would be understood by persons skilled in the relevant art(s).

The example embodiments described herein are provided for illustrative purposes, and are not limiting. Further structural and operational embodiments, including modifications/alterations, will become apparent to persons skilled in the relevant art(s) from the teachings herein.

Exemplary Communications Environments

FIG. 1A illustrates a block diagram of a communication environment according to an exemplary embodiment of the present invention. A communication environment 100 is an exemplary representation of a single-input and multiple-output (SIMO) communications environment that includes the use of a single transmit antenna at a communications transmitter 102 and multiple receive antennas at a communications receiver 106. The communication environment 100 includes the communications transmitter 102 to transmit at least one information signal as received from at least one transmitter user device, denoted as information signals 150.1 through 150.K, to the communications receiver 106 via a communication channel 104. The transmitter user devices may include, but are not limited to, personal computers, data terminal equipment, telephony devices, broadband media players, personal digital assistants, software applications, or any other medium capable of transmitting or receiving data. However, those skilled in the relevant art(s) will recognize that the information signals 150.1 through 150.K may include a single information signal, such as the information signal 150.1 to provide an example, without departing from the spirit and scope of the present invention.

The communications transmitter 102 produces a transmitted communications signal 152 by encoding the information signals 150.1 through 150.K according to a known single stream communications standard, such as, but not limited to, the Institute of Electrical and Electronics Engineers (IEEE) 802.11a™ standard, the IEEE 802.11b™ standard, the IEEE 802.11g™ standard, and/or any other suitable single stream communications standard. The IEEE 802.11a™ standard, the IEEE 802.11b™ standard, and the IEEE 802.11g™ standard are incorporated herein by reference in their entirety. As shown in FIG. 1A, the transmitted communications signal 152 represents a single stream communications signal. In other words, the communications transmitter 102 may encode the information signals 150.1 through 150.K to produce the transmitted communications signal 152.

The transmitted communications signal 152 passes through the communication channel 104 to produce received communications signals 154.1 through 154.N. The communication channel 104 may include, but is not limited to, a microwave radio link, a satellite channel, a fiber optic cable, a hybrid fiber optic cable system, or a copper cable to provide some examples. The communication channel 104 contains a propagation medium that the transmitted communications signal 152 passes through before reception by the communications receiver 106. The propagation medium of the communication channel 104 introduces interference and/or distortion into the transmitted communications signal 152 to produce received communications signals 154.1 through 154.N. For example, noise such as, but not limited to, thermal noise, burst noise, impulse noise, interference, signal strength variations known as fading, phase shift variations, to provide some examples, may introduce interference and/or distortion into the transmitted communications signal 152. In addition, the propagation medium of the communication channel 104 may cause the transmitted communications signal 152 to reach the communications receiver 106 by multiple communication paths, reflecting from different objects, surface areas, surface boundaries, and interfaces in the communication environment 100. Potential causes of multipath propagation may include, but are not limited to, atmospheric ducting, ionospheric reflection and/or refraction, and/or reflection from terrestrial objects such as mountains and/or buildings to provide some examples.

The communications receiver 106 may include at least one receiving antenna to capture the received communications signals 154.1 through 154.N. In an exemplary embodiment, the communications receiver 106 includes two receiving antenna to capture the received communications signals 154.1 through 154.2. The received communications signals 154.1 through 154.N represent the multiple communication paths traversed by the transmitted communications signal 152 resulting from the multipath propagation introduced by the communication channel 104. For example, the received communications signal 154.1 represents the transmitted communications signal 152 as it traverses through a first communication path of the communication channel 104. Likewise, the received communications signal 154.N represents the transmitted communications signal 152 as it traverses through an $N^{th}$ communication path of the communication channel 104. The communications receiver 106 may recover the at least one information signal from the at least one transmitter user device to produce at least one recovered information signal, denoted as recovered information signals 156.1 through 156.K, for at least one receiver user device by operating upon the received communications signals 154.1 through 154.N according to the known single stream communications standard. The receiver user devices may include, but are not limited to, personal computers, data terminal equipment, telephony devices, broadband media players, personal digital assistants, software applications, or any other medium capable of transmitting or receiving data. However, those skilled in the relevant art(s) will recognize that the recovered information signals 156.1 through 156.K may include a single recovered information signal, such as the recovered information signal 156.1 to provide an example, without departing from the spirit and scope of the present invention.

Figure 1B:
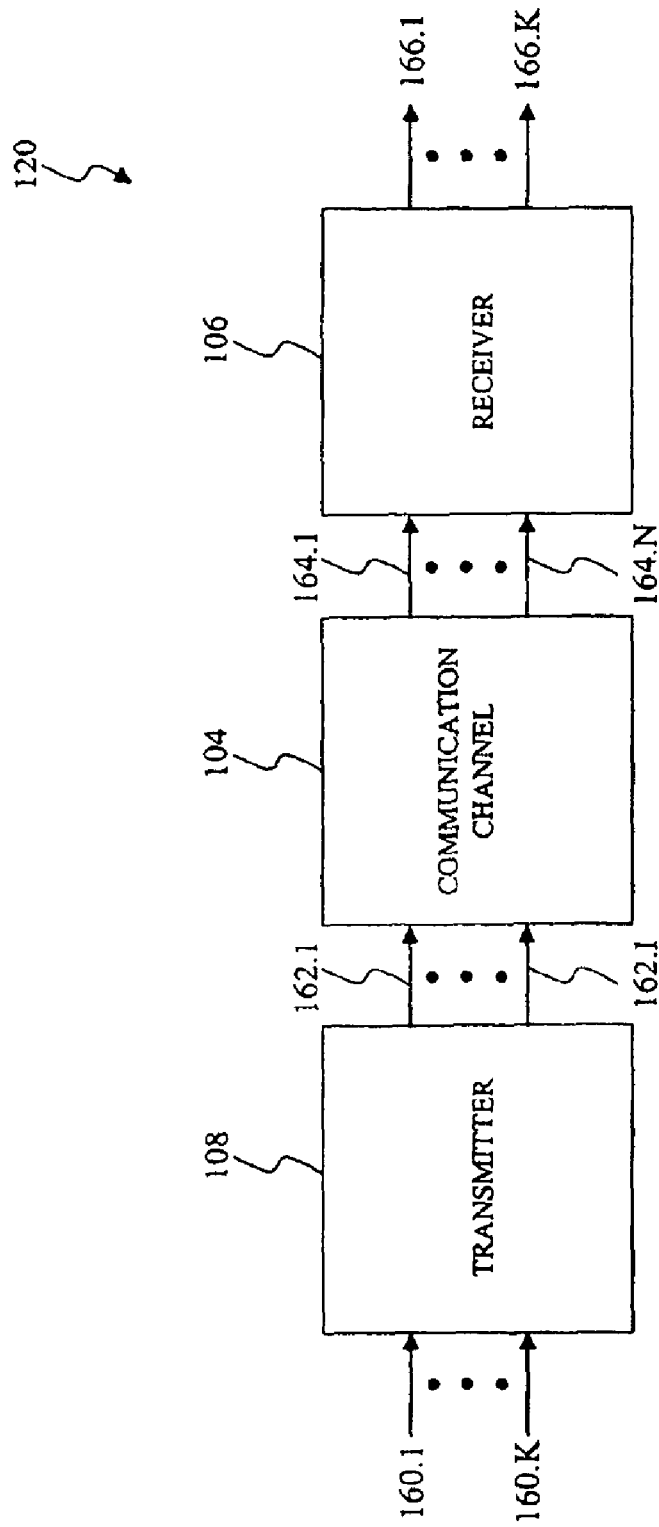
FIG. 1B illustrates a block diagram of another communication environment according to another exemplary embodiment of the present invention.

FIG. 1B illustrates a block diagram of another communication environment according to another exemplary embodiment of the present invention. A communication environment 120 is an exemplary representation of a multiple-input and multiple-output (MIMO) communications environment that includes the use of multiple transmit antennas at a communications transmitter 108 and multiple receive antennas at the communications receiver 106. The communication environment 120 includes the communications transmitter 108 to transmit at least one information signal as received from at least one transmitter user device, denoted as information signals 160.1 through 160.K, to the communications receiver 106 via a communication channel 104. The transmitter user devices may include, but are not limited to, personal computers, data terminal equipment, telephony devices, broadband media players, personal digital assistants, software applications, or any other medium capable of transmitting or receiving data. However, those skilled in the relevant art(s) will recognize that the information signals 160.1 through 160.K may include a single information signal, such as the information signal 160.1, without departing from the spirit and scope of the present invention.

The communications transmitter 108 produces transmitted communications signals 162.1 through 162.I by encoding the information signals 160.1 through 160.K according to a known multiple stream communications standard such as, but not limited to, the IEEE 802.11n™ standard, and/or any other suitable multiple stream communications standard. The IEEE 802.11n™ standard is incorporated herein by reference in its entirety. As shown in FIG. 1B, the transmitted communications signals 162.1 through 162.I together represent a multiple stream communications signal. The communications transmitter 108 may encode at least one of the information signals 160.1 through 160.K to produce the transmitted communications signals 162.1 through 162.I. For example, the communications transmitter 108 may encode the information signal 160.1 to produce the transmitted communications signal 162.1. Alternatively, the communications transmitter 108 may encode more than one of information signals 160.1 through 160.K to produce at least one transmitted communications signal 162.1 through 162.I. For example, the communications transmitter 108 may encode the information signal 160.1 and the information signal 160.2 to produce the transmitted communications signal 162.1.

The transmitted communications signals 162.1 through 162.I pass through the communication channel 104 to produce received communications signals 164.1 through 164.N. The transmitted communications signals 162.1 through 162.I may include a similar or a dissimilar number of communications signals as the received communications signals 164.1 through 164.N. The propagation medium of the communication channel 104 introduces interference and/or distortion into the transmitted communications signals 162.1 through 162.I to produce the received communications signals 164.1 through 164.N. For example, noise such as, but not limited to, thermal noise, burst noise, impulse noise, interference, signal strength variations known as fading, phase shift variations, to provide some examples, may introduce interference and/or distortion into the transmitted communications signals 162.1 through 162.I. In addition, the propagation medium of the communication channel 104 may cause each of transmitted communications signals 162.1 through 162.I to reach the communications receiver 106 by multiple communication paths, reflecting from different objects, surface areas, surface boundaries, and interfaces in the communication environment 120. Potential causes of multipath propagation may include, without limitation, atmospheric ducting, ionospheric reflection and/or refraction, and/or reflection from terrestrial objects such as mountains and/or buildings to provide some examples.

Referring back to FIG. 1B, the communications receiver 106 includes multiple receiving antenna to capture the received communications signals 164.1 through 164.N. In an exemplary embodiment, the communications receiver 106 includes two receiving antennas to capture the received communications signals 164.1 through 164.2. The received communications signals 164.1 through 164.N represent the multiple communication paths traversed by each of the transmitted communications signals 162.1 through 162.I resulting from the multipath propagation introduced by the communication channel 104. For example, the received communications signal 164.1 represents the transmitted communications signals 162.1 through 162.I as they traverse through a first communication path of the communication channel 104. Likewise, the received communications signal 164.N represents the transmitted communications signals 162.1 through 162.I as they traverse through an $N^{th}$ communication path of the communication channel 104.

The communications receiver 106 may recover the at least one information signal from the at least one transmitter user device to produce at least one recovered information signal, denoted as recovered information signals 166.1 through 166.K, for at least one receiver user device by operating upon the received communications signals 164.1 through 164.N according to the known multiple stream communications standard. The receiver user devices may include, but are not limited to, personal computers, data terminal equipment, telephony devices, broadband media players, personal digital assistants, software applications, or any other medium capable of transmitting or receiving data. However, those skilled in the relevant art(s) will recognize that the recovered information signals 166.1 through 166.K may include a single recovered information signal, such as the recovered information signal 166.1 to provide an example, without departing from the spirit and scope of the present invention.

As shown in FIG. 1A and FIG. 1B, the communications receiver 106 may, according to the invention, operate in the SIMO communications environment represented by the communications environment 100 and/or the MIMO communications environment represented by the communications environment 120. However, this example is not limiting, the communications receiver 106 may operate in any suitable communications environment that will be apparent to one skilled in the relevant art(s) without departing from the spirit and scope of the present invention.

Exemplary Communications Receiver

Figure 2:
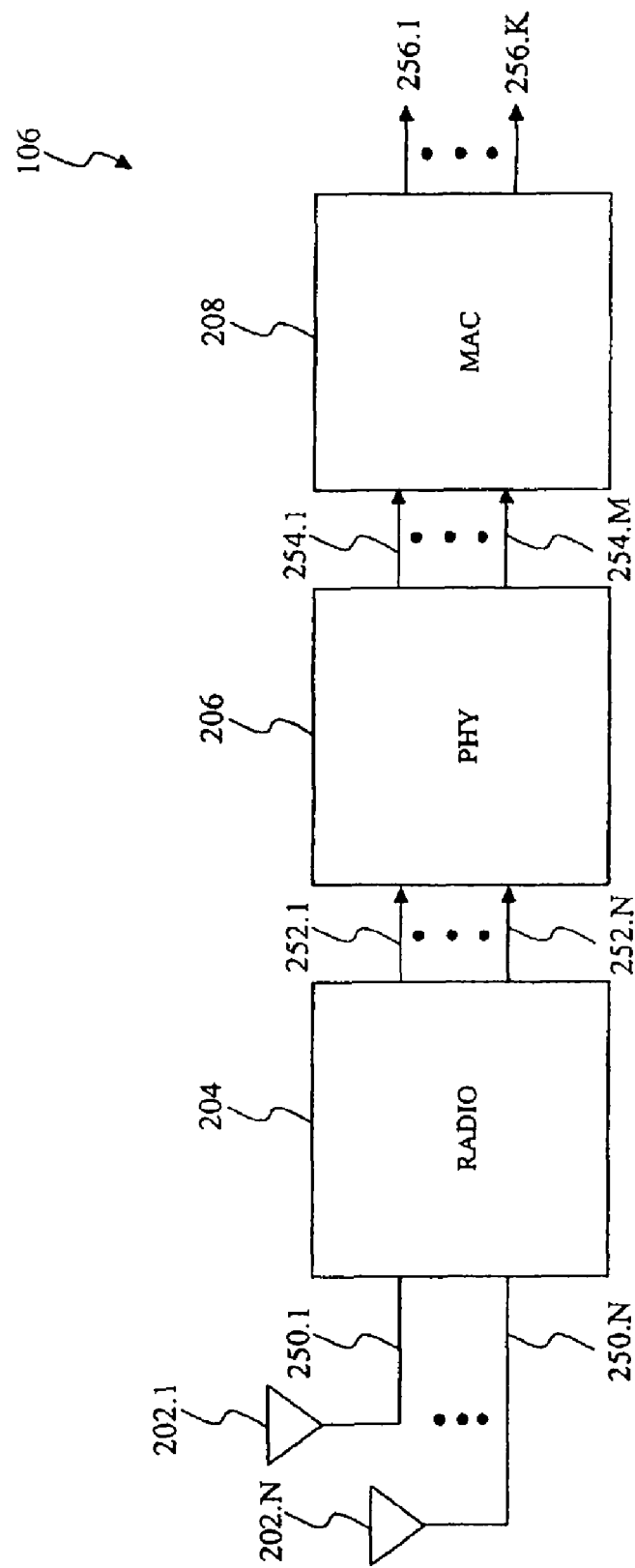
FIG. 2 illustrates a block diagram of a communications receiver according to an exemplary embodiment of the present invention.

FIG. 2 illustrates a block diagram of a communications receiver according to an exemplary embodiment of the present invention. More specifically, FIG. 2 illustrates a block diagram of an exemplary embodiment of the communications receiver 106 as shown in FIG. 1A and FIG. 1B. As will be understood by persons skilled in the relevant art(s) from the teachings provided herein, the communications receiver 106 may be readily implemented in hardware, software, or a combination of hardware and software. For example, based on the teachings provided herein, a person skilled in the relevant art(s) could implement the communications receiver 106 via a combination of at least one application specific integrated circuit and a processor core for implementing software commands stored in at least one attached memory. However, this example is not limiting, and other implementations are within the scope and spirit of the present invention.

As shown in FIG. 2, the communications receiver 106 includes receiving antennas 202.1 through 202.N, a radio receiver 204, a physical layer interface (PHY) 206, and a media access controller (MAC) 208. The receiving antennas 202.1 through 202.N capture the received communications signals 154.1 through 154.N, the received communications signals 164.1 through 164.N, and/or any suitable combination thereof as shown in FIG. 1A through FIG. 1B. The receiving antennas 202.1 through 202.N convert either the received communications signals 154.1 through 154.N, the received communications signals 164.1 through 164.N, and/or the suitable combination thereof from electromagnetic waves to modulated radio frequency (RF) currents, denoted as received communications signals 250.1 through 250.N in FIG. 2. For example, the receiving antenna 202.1 may produce the received communications signal 250.1 by converting the received communications signal 154.1 from an electromagnetic wave to a modulated RF current. In an exemplary embodiment, the communications receiver 106 includes the receiving antennas 202.1 through 202.N. However, this example is not limiting, the receiving antenna 202 may include any suitable number of antenna without departing the scope and spirit of the present invention.

The radio receiver 204 operates on the received communications signals 250.1 through 250.N to produce downconverted communications signals 252.1 through 252.N. For example, the radio receiver 204 may downconvert the received communications signals 250.1 through 250.N to baseband or any suitable intermediate frequency (IF) to produce the downconverted communications signals 252.1 through 252.N. The radio receiver 204 may additionally perform functions such as, but not limited to, filtering, and/or automatic gain control (AGC).

The PHY 206 provides an interface between the radio receiver 204 and the MAC 208. However, those skilled in the relevant art(s) will recognize that the PHY 206 may directly receive a baseband or near baseband communications signal, such as Asymmetric Digital Subscriber Line (ADSL) to provide an example, from the communication channel 104 without departing from the spirit and scope of the present invention. In other words, herein the radio receiver 204 is optional, the PHY 206 may receive a communications signal, such as the received communications signals 154.1 through 154.N and/or the received communications signals 164.1 through 164.N, directly from the communication channel 104 via the receiving antennas 202.1 through 202.N. The PHY 206 processes the downconverted communications signals 252.1 through 252.N to produce decoded communications signals 254.1 through 254.M. More specifically, the PHY 206 decodes the downconverted communications signals 252.1 through 252.N to produce the decoded communications signal 254 according to the known single stream communications standard and/or the known multiple stream communications standard. In an exemplary embodiment, the PHY 206 produces the decoded communications signal 254.1 and the decoded communications signal 254.2, wherein the decoded communications signal 254.1 corresponds to the received communications signals 164.1 through 164.N in the communications environment 120 as shown in FIG. 1B and the decoded communications signal 254.2 corresponds to the received communications signals 154.1 through 154.N in the communications environment 100 as shown in FIG. 1A. However, this example is not limiting, the decoded communications signals 254.1 through 254.M may include any suitable number of decoded communications signals without departing the scope and spirit of the present invention.

The MAC 208 may produce at least one recovered information signal, denoted as recovered information signals 256.1 through 256.K, for at least one receiver user device by operating upon the decoded communications signals 254.1 through 254.M according to the known single stream communications standard and/or the known multiple stream communications standard. The recovered information signals 256.1 through 256.K may represent the recovered information signals 156.1 through 156.K as discussed in the communications environment 100 of FIG. 1A, the recovered information signals 166.1 through 166.K as discussed in the communications environment 120 of FIG. 1B, and/or any suitable combination thereof. The MAC 208 may process at least one decoded communications signal 254.1 through 254.M according to the known single stream communications standard and/or the known multiple stream communications standard to produce at least one recovered information signal 256.1 through 256.K. For example, the MAC 208 may process decoded communications signals 254.1 through 254.4 according to the known single stream communications standard and/or the known multiple stream communications standard to produce the recovered information signal 256.1. Alternatively, the MAC 208 may process the decoded communications signal 254.1 according to the known single stream communications standard and/or the known multiple stream communications standard to produce the recovered information signals 256.1 and 256.2. The MAC 208 may additionally, without limitation, provide addressing and channel access control mechanisms that make it possible for multiple terminals or network nodes to communicate within the multipoint network, typically a local area network (LAN), metropolitan area network (MAN), or a wide area network (WAN).

Exemplary Physical Layer Interface

Figure 3:
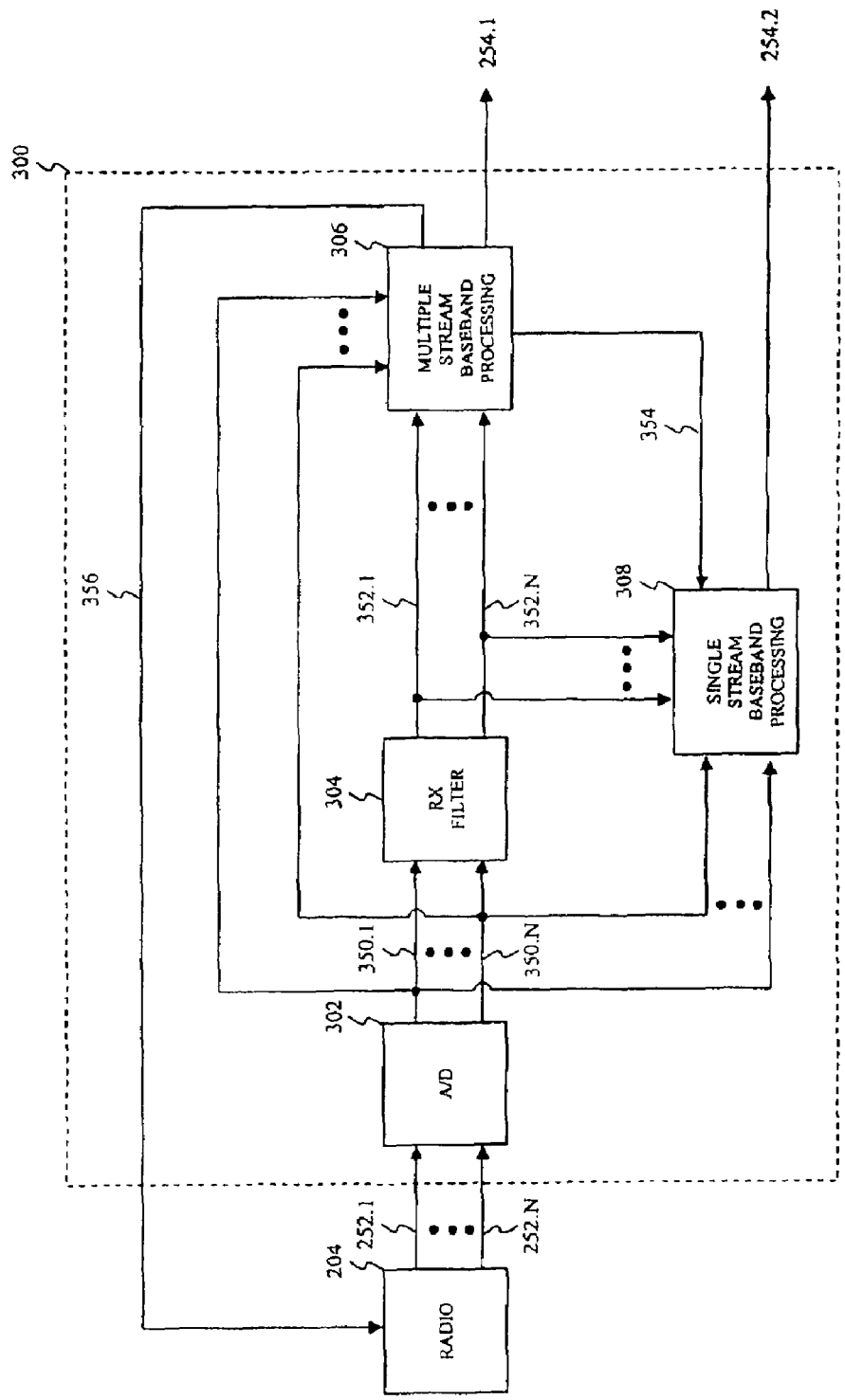
FIG. 3 illustrates a block diagram of a physical layer interface (PHY) according to an exemplary embodiment of the present invention.

FIG. 3 illustrates a block diagram of a physical layer interface (PHY) according to an exemplary embodiment of the present invention. A PHY 300 provides an interface between a media access controller, such as the MAC 208, and a communication channel, such as the communication channel 104, in accordance with the known single stream communications standard and/or the known multiple stream communications standard. The PHY 300 may represent an exemplary embodiment of the PHY 206 as shown in FIG. 2.

The PHY 300 includes an analog to digital converter (ADC) 302, a PHY receiver filter 304, a multiple stream baseband processing module 306, and a single stream baseband processing module 308. The ADC 302 produces digital communications signals 350.1 through 350.N based on the downconverted communications signals 252.1 through 252.N. More specifically, the ADC 302 converts the downconverted communications signals 252.1 through 252.N from an analog representation to a digital representation to produce the digital communications signals 350.1 through 350.N.

The PHY receiver filter 304 produces encoded multiple stream communications signals 352.1 through 352.N based on the digital communications signals 350.1 through 350.N. The PHY receiver filter 304 may select among one or more PHY receiver filter bandwidths to filter at least one single stream signal field and/or at least one multiple stream signal field. For example, the PHY receiver filter 304 may select at least one of a training sequence bandwidth to filter the single stream preamble and/or the multiple stream preamble, a single stream information payload bandwidth to filter the single stream information payload, and/or a multiple stream information payload bandwidth to filter the multiple stream information payload. Further discussion of the PHY receiver filter 304 is disclosed in U.S. patent application Ser. No. 12/211,176, which is incorporated by reference in its entirety.

The multiple stream baseband processing module 306 produces the decoded communications signal 254.1 based on the digital communications signals 350.1 through 350.N and/or the encoded multiple stream communications signals 352.1 through 352.N. The functionality of the multiple stream baseband processing module 306 may include, without limitation, calculating a power level of or a magnitude of at least one digital communications signal 350.1 through 350.N, detecting the presence of the multiple stream communications signal from the encoded multiple stream communications signals 352.1 through 352.N, and/or decoding of the encoded multiple stream communications signals 352.1 through 352.N according to the known multiple stream communications standard.

The multiple stream baseband processing module 306 may calculate or gather at least one signal metric, such as but not limited to, the mean, the total energy, the average power, the mean square, the instantaneous power, the root mean square, the variance, the norm, and/or any other suitable signal metric to provide some examples, of at least one digital communications signal 350.1 through 350.N. The multiple stream baseband processing module 306 may generate a single stream selection signal 354 based on the at least one signal metric to be used by the single stream baseband processing module 308.N to select one of the digital communications signals 350.1 through 350.N and/or one of the encoded multiple stream communications signals 352.1 through 352.N. The multiple stream baseband processing module 306 may generate a radio adjustment signal 356 to configure a gain of the radio receiver 204 based on the at least one signal metric. Further discussion of multiple stream baseband processing module 306 is disclosed in U.S. patent application Ser. No. 12/213,172, filed on Jun. 16, 2008, which is incorporated by reference in its entirety.

The single stream baseband processing module 308 produces the decoded communications signal 254.2 based on the digital communications signals 350.1 through 350.N, the encoded multiple stream communications signals 352.1 through 352.N, and/or the single stream selection signal 354. More specifically, the single stream baseband processing module 308 selects one of the digital communications signals 350.1 through 350.N or one of the encoded multiple stream communications signals 352.1 through 352.N based on the single stream selection signal 354 to produce an encoded single stream communications signal. The single stream baseband processing module 308 may, without limitation, detect the presence of the single stream communications signal from the encoded single stream communications signal and/or decode the encoded single stream communications signal in accordance with the single stream communications standard to provide some examples. Further discussion of the single stream baseband processing module 308 is disclosed in U.S. patent application Ser. No. 12/213,172, filed on Jun. 16, 2008, which is incorporated by reference in its entirety.

Exemplary Radio Receivers

Figure 4:
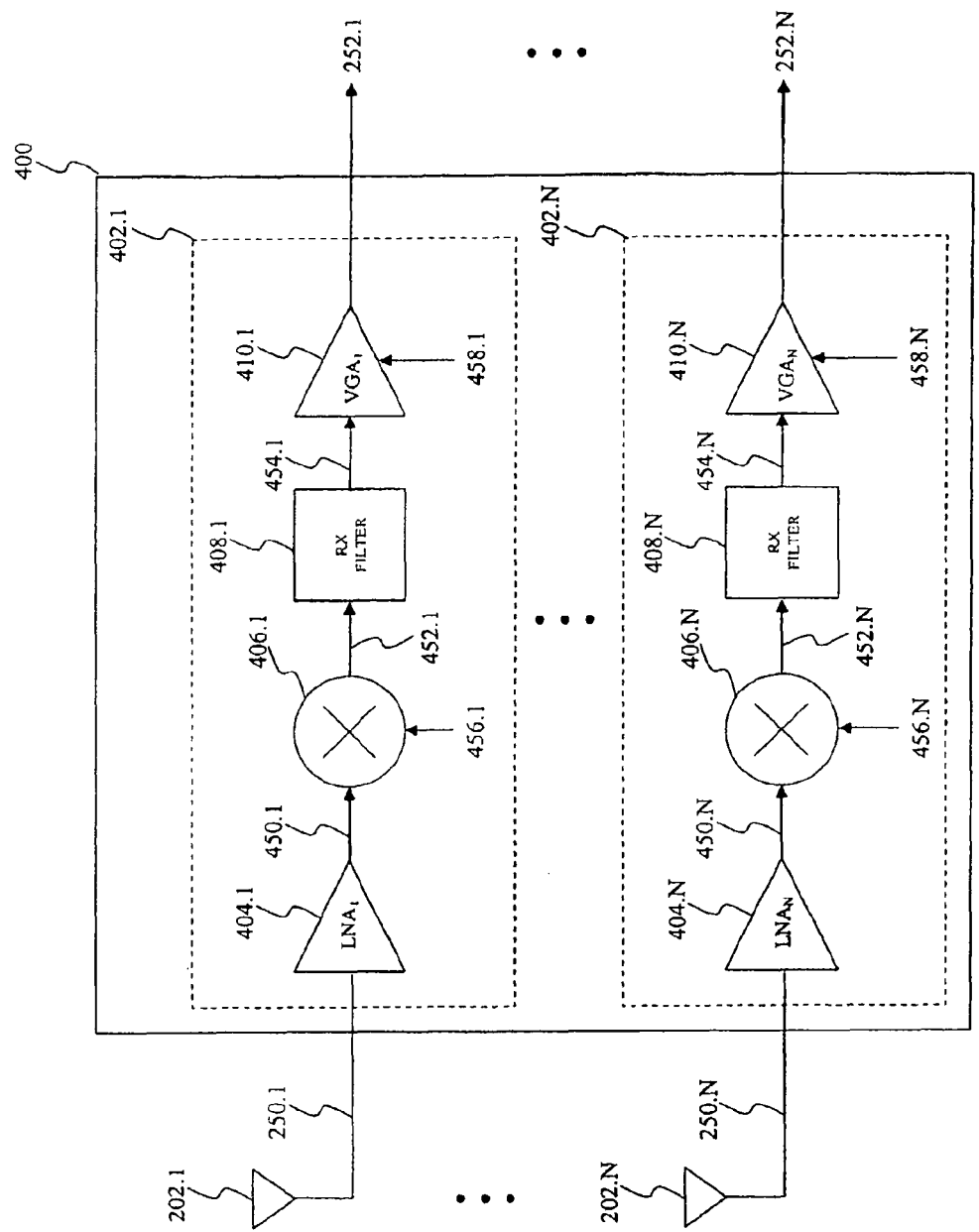
FIG. 4 illustrates a block diagram of a radio receiver according to an exemplary embodiment of the present invention.

FIG. 4 illustrates a block diagram of a radio receiver according to an exemplary embodiment of the present invention. A radio receiver 400 operates on the received communications signals 250.1 through 250.N as captured from a communication channel, such as the communication channel 104 to provide an example, by receiving antennas 202.1 through 202.N to produce downconverted communications signals 252.1 through 252.N. For example, the radio receiver 400 may downconvert the received communications signals 250.1 through 250.N to baseband or any suitable intermediate frequency (IF) to produce the downconverted communications signals 252.1 through 252.N. The radio receiver 400 may represent an exemplary embodiment of the radio receiver 204 as shown in FIG. 2.

The radio receiver 400 includes radio receiver chains 402.1 through 402.N, each radio receiver chain 402.1 through 402.N is configured to receive a corresponding received communications signal 250.1 through 250.N and to produce a corresponding downconverted communications signal 252.1 through 252.N. The downconverted communications signals 252.1 through 252.N may include at least one single stream signal field according to the known single stream communications standard and/or at least one multiple stream signal field according to the known multiple stream communications standard. The single stream signal field may include a single stream preamble and/or a single stream information payload. Likewise, the multiple stream signal field may include a multiple stream preamble and/or a multiple stream information payload. Further discussion of the at least one single stream signal field and/or the at least one multiple stream signal field is disclosed in U.S. patent application Ser. No. 12/213,176, filed on Jun. 16, 2008, which is incorporated by reference in its entirety.

In an exemplary embodiment, each receiving antenna 202.1 through 202.N is coupled to a corresponding radio receiver chain 402.1 through 402.N. However, this example is not limiting, those skilled in the relevant art(s) will recognize that receiving antenna 202.1 through 202.N may be coupled to at least one corresponding radio receiver chain 402.1 through 402.N without departing from the spirit and scope of the present invention. The radio receiver chains 402.1 through 402.N operate in a substantially similar manner, thus only radio receiver chain 402.1 will be described in further detail.

The radio receiver chain 402.1 includes a low noise amplifier (LNA) 402.1, a mixer 406.1, a radio receiver filter 408.1, and a variable gain amplifier (VGA) 410.1. The LNA 404.1 receives the received communications signal 250.1 as captured from a communication channel, such as the communication channel 104 to provide an example, by the receiving antenna 202.1. The LNA 404.1 amplifies or attenuates the received communications signal 250.1 by a LNA gain, denoted as $LNA_1$ in FIG. 4, to produce an attenuated communications signal 450.1.

The mixer 406.1 downconverts the attenuated communications signal 450.1 to baseband or any suitable intermediate frequency (IF) to produce the downconverted communications signal 452.1 based on a local oscillator (LO) reference frequency 456.1. The local oscillator (LO) reference frequencies 456.1 through 456.N may be similar and/or dissimilar in frequency to each other. For example, all of the LO reference frequencies 456.1 through 456.N may be similar in frequency or at least one group of the LO reference frequencies 456.1 through 456.N may be similar in frequency. Those skilled in the relevant art(s) will recognize that the functionality of the LNA 404.1 and the mixer 406.1, as described above, may be implemented using a low-noise block (LNB) without departing from the spirit and scope of the present invention.

The radio receiver filter 408.1 produces a filtered communications signal 454.1 based on the downconverted communications signal 452.1. The radio receiver filter 408.1 may select among one or more radio receiver filter bandwidths to filter the at least one single stream signal field and/or the at least one multiple stream signal field. For example, the radio receiver filter 408.1 may select at least one of a training sequence bandwidth to filter the single stream preamble and/or the multiple stream preamble, a single stream information payload bandwidth to filter the single stream information payload, and/or a multiple stream information payload bandwidth to filter the multiple stream information payload. Further discussion of the radio receiver filter 408.1 is disclosed in U.S. patent application Ser. No. 12/213,176, filed on Jun. 16, 2008, which is incorporated by reference in its entirety.

The VGA 410.1 amplifies or attenuates the filtered communications signal 454.1 by a VGA gain, denoted as $VGA_1$ in FIG. 4, to produce the downconverted communications signal 252.1. The VGA gain may be dynamically configured in response to a radio receiver gain control signal 458.1. The radio receiver gain control signals 458.1 through 458.N may be similar and/or dissimilar to each other. For example, all of the radio receiver gain control signals 458.1 through 458.N may be similar causing all of the VGAs 410.1 through 410.N to have a substantially similar gain or at least one radio receiver gain control signal 458.1 through 458.N may be similar causing at least one of the VGAs 410.1 through 410.N to have a substantially similar gain. The radio receiver gain control signals 458.1 through 458.N may represent an exemplary embodiment of the radio adjustment signal 356 as described in FIG. 3. The radio adjustment signal 356 may include a single radio adjustment signal 356 coupled to all of the radio receiver gain control signals 458.1 through 458.N or at least one radio adjustment signal 356 coupled to at least one radio receiver gain control signal 458.1 through 458.N.

Figure 5:
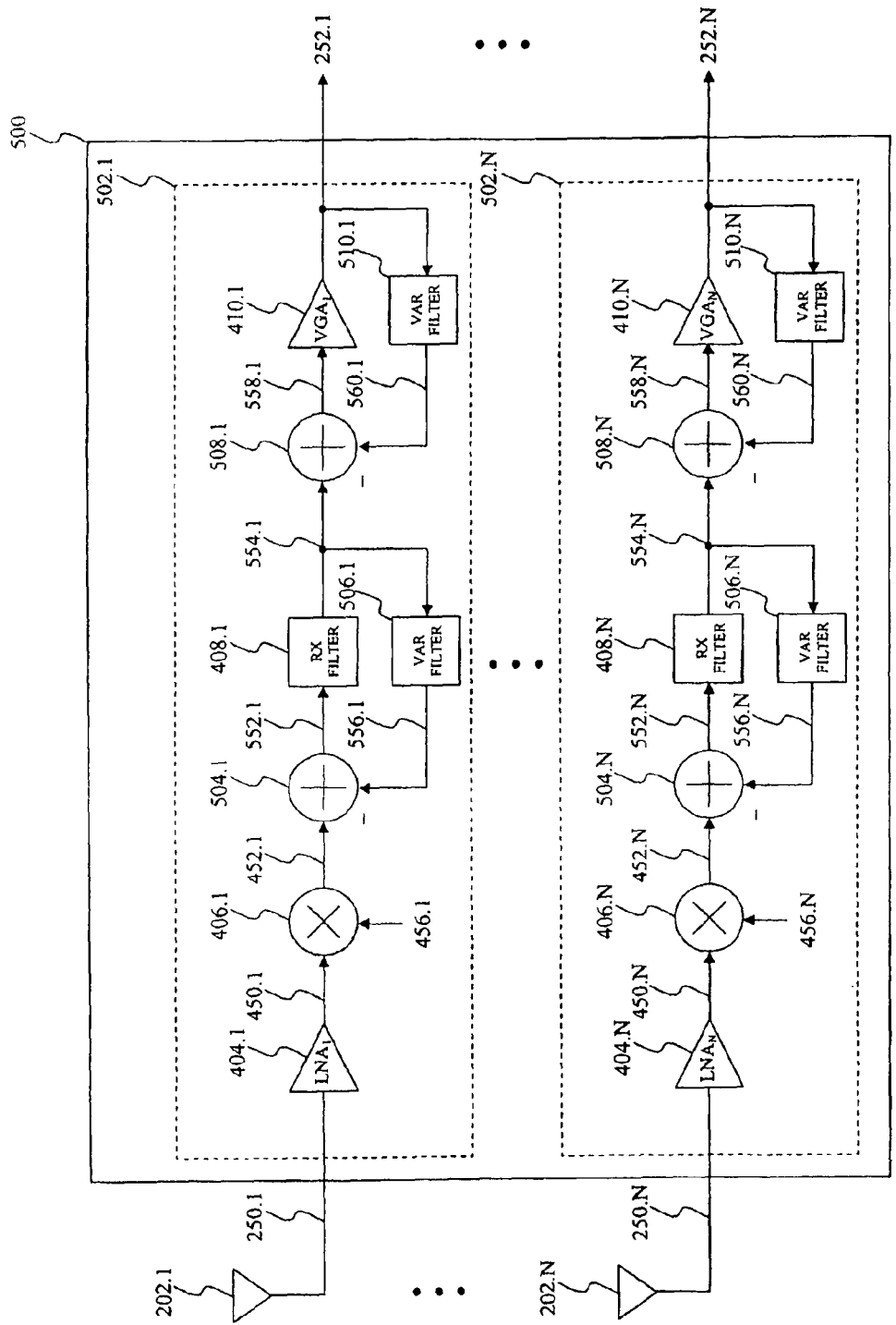
FIG. 5 illustrates another block diagram of the radio receiver according to another exemplary embodiment of the present invention.

FIG. 5 illustrates another block diagram of the radio receiver according to another exemplary embodiment of the present invention. A radio receiver 500 operates on the received communications signals 250.1 through 250.N as captuled from a communication channel, such as the communication channel 104 to provide an example, by receiving antennas 202.1 through 202.N to produce downconverted communications signals 252.1 through 252.N. For example, the radio receiver 500 may downconvert the received communications signals 250.1 through 250.N to baseband or any suitable intermediate frequency (IF) to produce the downconverted communications signals 252.1 through 252.N. The radio receiver 500 may additionally perform functions such as, but not limited to, filtering, and/or automatic gain control (AGC). The radio receiver 500 may represent an exemplary embodiment of the radio receiver 204 as shown in FIG. 2.

The radio receiver 500 includes radio receiver chains 502.1 through 502.N, each radio receiver chain 502.1 through 502.N is configured to receive a corresponding received communications signal 250.1 through 250.N and to produce a corresponding downconverted communications signal 252.1 through 252.N. In an exemplary embodiment, each receiving antenna 202.1 through 202.N is coupled to a corresponding radio receiver chain 502.1 through 502.N. However, this example is not limiting, those skilled in the relevant art(s) will recognize that receiving antenna 202.1 through 202.N may be coupled to at least one corresponding radio receiver chain 502.1 through 502.N without departing from the spirit and scope of the present invention. The radio receiver chains 502.1 through 502.N operate in a substantially similar manner as the radio receiver chains 402.1 through 402.N, thus only differences between the radio receiver chain 402.1 and the radio receiver chain 502.1 are to be discussed in further detail.

The radio receiver chain 502.1 includes a first combination module 504.1, a first variable low pass filter 506.1, a second combination module 508.1, and a second variable low pass filter 510.1. The first combination module 504.1 produces a highpass filtered communications signal 552.1 by combining the downconverted communications signal 452.1 and a lowpass filtered communications signal 556.1 to be discussed below. More specifically, the first combination module 504.1 subtracts the lowpass filtered communications signal 556.1 from the downconverted communications signal 452.1 to produce the highpass filtered communications signal 552.1.

The radio receiver filter 408.1, as discussed in FIG. 4, filters the highpass filtered communications signal 552.1 to produce a bandpass filtered communications signal 554.1.

The first variable low pass filter 506.1 produces the lowpass filtered communications signal 556.1 based on the bandpass filtered communications signal 554.1. Similar to the radio receiver filter 408.1, the first variable low pass filter 506.1 may select among one or more first variable low pass filter bandwidths to filter the at least one single stream signal field and/or the at least one multiple stream signal field. For example, the first variable low pass filter 506.1 may select at least one of a variable filter training sequence bandwidth to filter the single stream preamble and/or the multiple stream preamble and/or a variable filter information payload bandwidth to filter the single stream information payload and/or the multiple stream information payload. Both the variable filter training sequence bandwidth and the variable filter information payload bandwidth are discussed in further detail in FIG. 9.

The second combination module 508.1 produces a highpass amplified communications signal 558.1 by combining the bandpass communications signal 554.1 and a lowpass amplified communications signal 560.1 to be discussed below. More specifically, the second combination module 508.1 subtracts the lowpass amplified communications signal 560.1 from the bandpass communications signal 554.1 to produce the highpass amplified communications signal 558.1.

The VGA 410.1, as discussed in FIG. 4, amplifies or attenuates the highpass amplified communications signal 558.1 by a VGA gain, denoted as $VGA_1$ in FIG. 5, to produce the downconverted communications signal 252.1.

The second variable low pass filter 510.1 produces the lowpass filtered communications signal 556.1 based on the bandpass filtered communications signal 554.1. Similar to the radio receiver filter 408.1, the second variable low pass filter 510.1 may select among one or more second variable low pass filter bandwidths to filter the at least one single stream signal field and/or the at least one multiple stream signal field. For example, the second variable low pass filter 510.1 may select at least one of a variable filter training sequence bandwidth to filter the single stream preamble and/or the multiple stream preamble and/or a variable filter information payload bandwidth to filter the single stream information payload and/or the multiple stream information payload. Both the variable filter training sequence bandwidth and the variable filter information payload bandwidth are discussed in further detail in FIG. 9.

A combination of the first combination module 504.1 and the first variable low pass filter 506.1 and a combination of the second combination module 508.1 and the second variable low pass filter 510.1 represents a first variable highpass filter and a second variable highpass filter respectfully. In other words, the first combination module 504.1 subtracts spectral components not attenuated by the first variable low pass filter to substantially high pass filter the downconverted communications signal 452.1. Likewise, the second combination module 508.1 subtracts spectral components not attenuated by the second variable low pass filter to substantially high pass filter the bandpass communications signal 554.1.

Exemplary Transmitted Communications Signals

Figure 6:
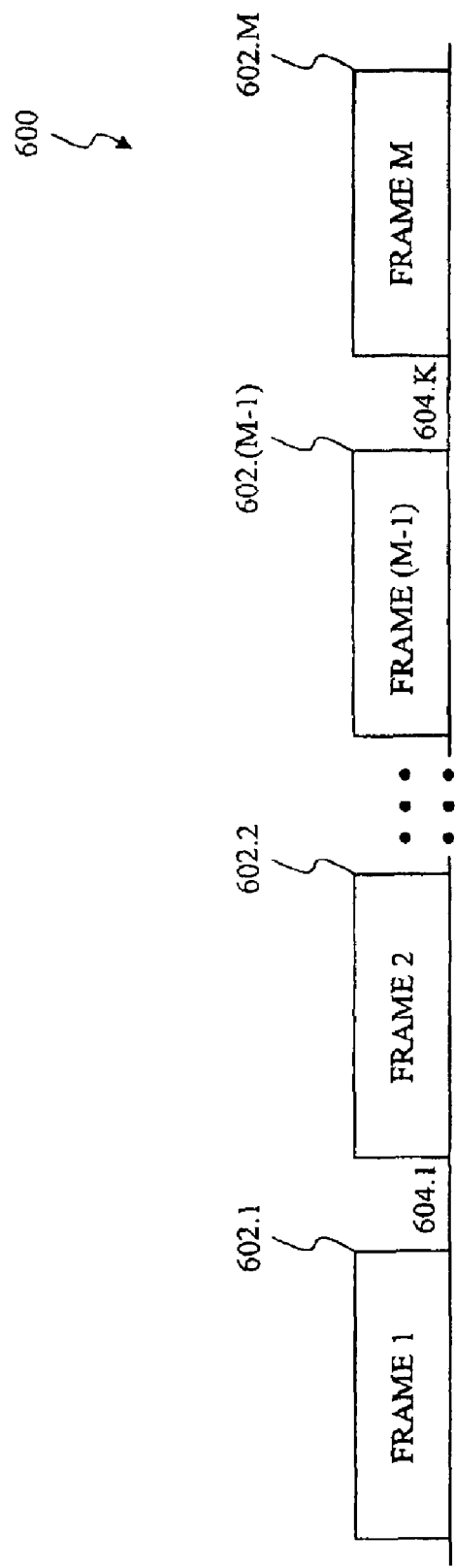
FIG. 6 illustrates a communications signal as received by the communications receiver according to an exemplary embodiment of the present invention.

FIG. 6 illustrates a communications signal as received by the communications receiver according to an exemplary embodiment of the present invention. A communications transmitter, such as the communications transmitter 102 an/or the communications transmitter 108, may transmit a transmitted communications signal 600. The transmitted communications signal 600 may represent an exemplary embodiment of a single stream communications signal, such as the transmitted communications signal 152 to provide an example, and/or a multiple stream communications signal, such as the transmitted communications signals 162.1 through 162.1. A communications receiver, such as the communications receiver 106 to provide an example, receives the transmitted communications signal 600 as it passes through a communication channel, such as the communication channel 104 to provide an example.

The transmitted communications signal 600 includes one or more frames 602.1 through 602.M. The one or more frames 602.1 through 602.M may include one or more data packets of fixed or variable length. For example, the one or more frames 602.1 through 602.M frame may include one or more bits, one or more bytes, one or more packets and/or any other suitable data length that will be apparent to those skilled in the relevant art(s) without departing from the spirit and scope of the present invention. Each one of the one or more frames 602.1 through 602.M may further include at least one single stream signal field such as, a single stream preamble, a single stream signal field, and/or a single stream single stream information payload to provide some examples and/or at least one multiple stream signal field such as, a multiple stream preamble, a multiple stream signal field, and/or a multiple stream information payload to provide some examples.

The transmitted communications signal 600 includes one or more interframe spacers 604.1 through 604.K corresponding to sequential frames from the one or more frames 602.1 through 602.M. More specifically, the one or more frames 602.1 through 602.M may be separated by a corresponding interframe spacer 604.1 through 604.K according to the known single stream communications standard and/or the known multiple stream communications standard. For example, the known single stream communications standard and/or the known multiple stream communications standard may provide for a reduced interframe spacing (RIFS) duration of approximately 2 μs and/or a short interframe spacing (SIFS) duration of approximately 10 μs.

The interframe spacers 604.1 through 604.K enable the communications receiver to recover at least one information payload, such as at least one information payload embedded in the at least one of the recovered information signals 156.1 through 156.K and/or the recovered information signals 166.1 through 166.K to provide some examples, embedded in the one or more frames 602.1 through 602.M. More specifically, the communications transmitter transmits a first corresponding one of the one or more frames 602.1 through 602.M, herein referred to as a first frame 602. After transmission of the first frame 602, the communications transmitter ceases to transmit for a duration of a corresponding one of the interframe spacers 604.1 through 604.K. For example, after transmission of the frame 602.1, the communications transmitter ceases to transmit for the duration of interframe spacer 604.1. The communications receiver may recover the at least one information payload embedded in the first frame 602 before the duration of the corresponding one of the interframe spacers 604.1 through 604.K lapses or expires, whereby the communications transmitter transmits the second frame 602 to the communications receiver.

Reconfiguration of Communications Receiver Gain

Figure 7A:
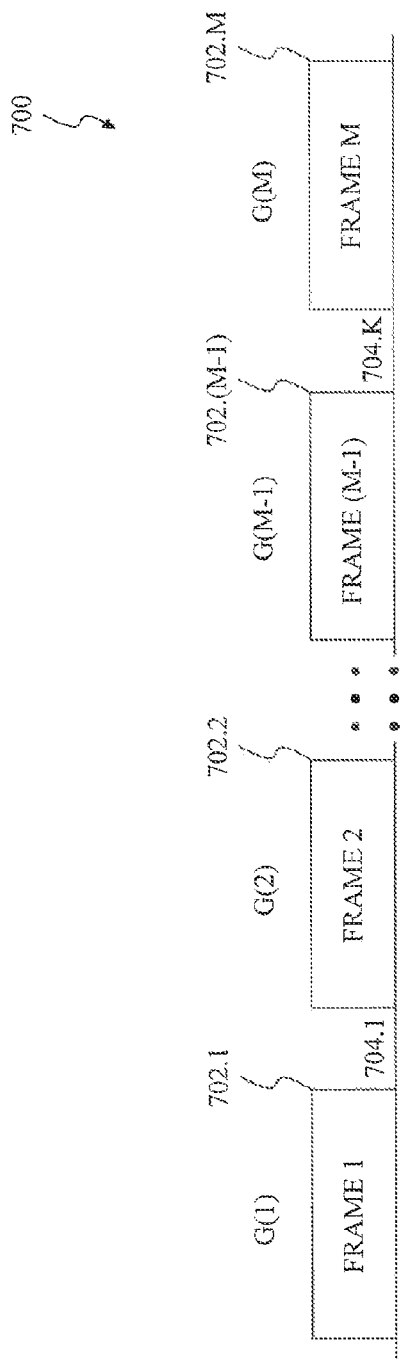
FIG. 7A illustrates a conventional transmitted communication signal as received by a conventional communications receiver.

FIG. 7A illustrates a conventional transmitted communication signal as received by a conventional communications receiver. A conventional communications receiver receives a transmitted communications signal 700 as it passes through a communication channel. The conventional communications receiver may recover at least one first conventional information signal, herein referred to as the first conventional information signal, from a first corresponding one of one or more frames 702.1 through 702.M, herein referred to as a first frame 702, during a corresponding one of the interframe spacers 704.1 through 704.K. The conventional communications receiver may additionally configure one or more conventional reception parameters to receive at least one second conventional information signal, herein referred to as the second conventional information signal, from a second corresponding one of one or more frames 702.1 through 702.M, herein referred to as a second frame 702. For example, the conventional communications receiver may recover the first conventional information signal from the frame 702.1 during the interframe spacer 704.1 and/or may configure one or more conventional reception parameters to receive the second conventional information signal from the second frame 702.2.

Figure 7B:
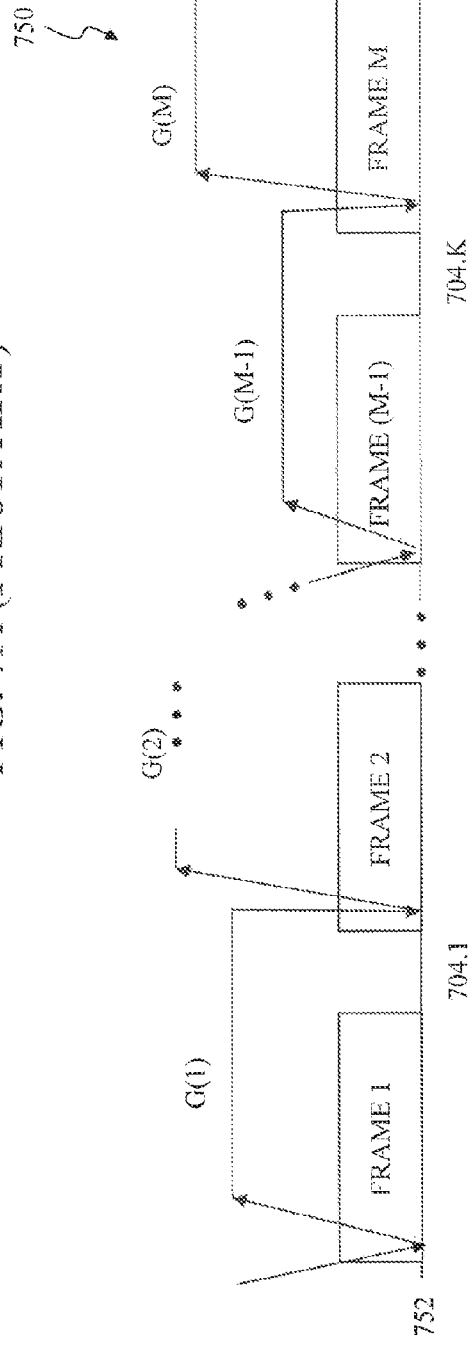
FIG. 7B illustrates a reconfiguration of a conventional communications receiver gain by the conventional communications receiver.

FIG. 7B illustrates a reconfiguration 750 of one or more conventional reception parameters by the conventional communications receiver. More specifically, reconfiguration 750 illustrates a conventional communications receiver gains G(1) through G(M) superimposed on the transmitted communications signal 700.

After the conventional communications receiver recovers the first information payload, the conventional communications receiver receives a conventional preamble, such as the single stream preamble and/or the multiple stream preamble, embedded in the second frame 702. After recovering the conventional preamble embedded in the second frame 702, the conventional communications receiver configures the one or more conventional reception parameters, such as the conventional communications receiver gains G(1) through G(M), to receive the second information payload based on an initial reception parameter 752. The conventional communications receiver uses the initial reception parameter 752, usually a value corresponding to zero, as a starting point to determine the one or more conventional reception parameters necessary to recover the second information payload. For example, to adjust a conventional communications receiver gain from a first conventional communications receiver gain G(1) to a second conventional communications receiver gain G(2), the conventional communications receiver adjusts the conventional communications receiver gain from the first conventional communications receiver gain G(1) to the initial reception parameter 752 followed by adjusting the value of the second conventional communications receiver gain G(2)

from the initial reception parameter 752 to the second conventional communications receiver gain G(2). Likewise, to adjust a conventional communications receiver gain from a (M−1)$^{th}$ conventional communications receiver gain G(M−1) to a M$^{th}$ conventional communications receiver gain G(M), the conventional communications receiver adjusts the conventional communications receiver gain from the (M−1)$^{th}$ conventional communications receiver gain G(M−1) to the initial reception parameter 752 followed by adjusting the value of the M$^{th}$ conventional communications receiver gain G(M) from the initial reception parameter 752 to the M$^{th}$ conventional communications receiver gain G(M).

If the duration of the corresponding one of the interframe spacers 704.1 through 704.K is insufficient, the conventional communications receiver may not recover the at the least one information signal embedded from the first frame 702 before the communications transmitter transmits the second frame 702. The conventional communications receiver may also not be configured to recover the second information payload embedded in the second frame 702. As a result, the conventional communications receiver may receive a portion of the at the least one information signal embedded in the second frame 702 with one or more reception parameters, such as receiver gain, receiver filter bandwidths, or any other suitable reception parameter that will apparent to one skilled in the relevant art(s), corresponding to the first frame 702. For example, the conventional communications receiver is incapable of completely recovering the at the least one information signal embedded from the first frame 702 before the communications transmitter transmits the second frame 702 in less than 2 µs. As a result, the conventional communications receiver may recover a portion of the at the least one information signal embedded in the second frame 702 with the conventional communications receiver gain corresponding to the first frame 702, and/or may not configure the one or more conventional reception parameters to receive the second information payload embedded in the second frame 702.

Figure 8A:
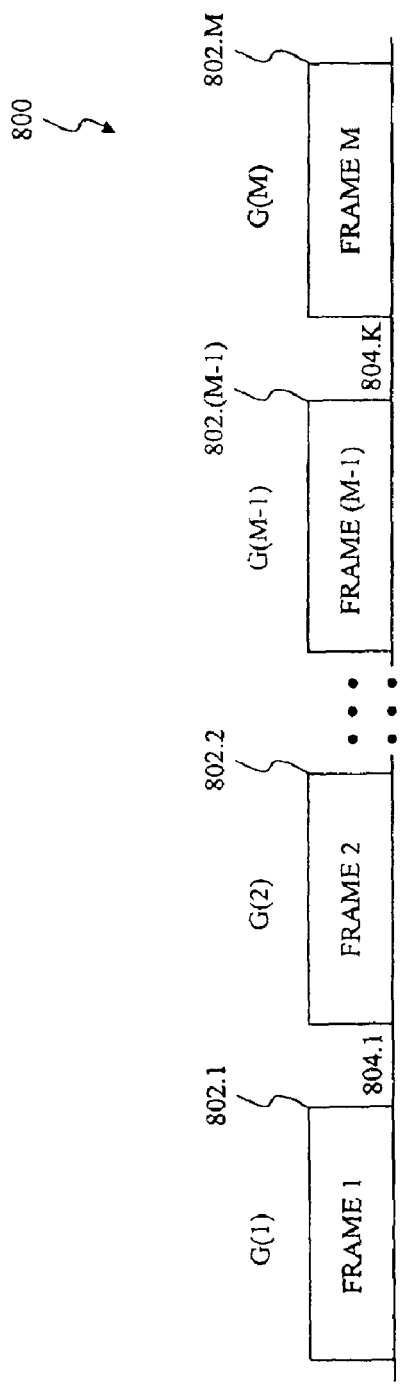
FIG. 8A illustrates another communications signal as received by the communications receiver according to another exemplary embodiment of the present invention.

FIG. 8A illustrates another communications signal as received by a communications receiver according to another exemplary embodiment of the present invention. A communications receiver, such as the communications receiver 106 to provide an example, receives a transmitted communications signal 800 as it passes through a communication channel, such as the communication channel 104 to provide an example. The communications receiver may recover at least one first information payload, such as at least one information payload embedded in at least one of the recovered information signals 156.1 through 156.K and/or the recovered information signals 166.1 through 166.K to provide some examples, herein referred to as a first information payload, from a first corresponding one of one or more frames 802.1 through 802.M, herein referred to as a first frame 802, during a corresponding one of the interframe spacers 804.1 through 804.K and/or may configure one or more reception parameters to receive at least one second information payload, herein referred to as the second information payload, embedded in a second corresponding one of one or more frames 802.1 through 802.M, herein referred to as a second frame 802. For example, the communications receiver may recover the first information payload from the frame 802.1 during the interframe spacer 804.1 and/or may configure one or more reception parameters to receive the second information payload from the second frame 802.2.

Figure 8B:
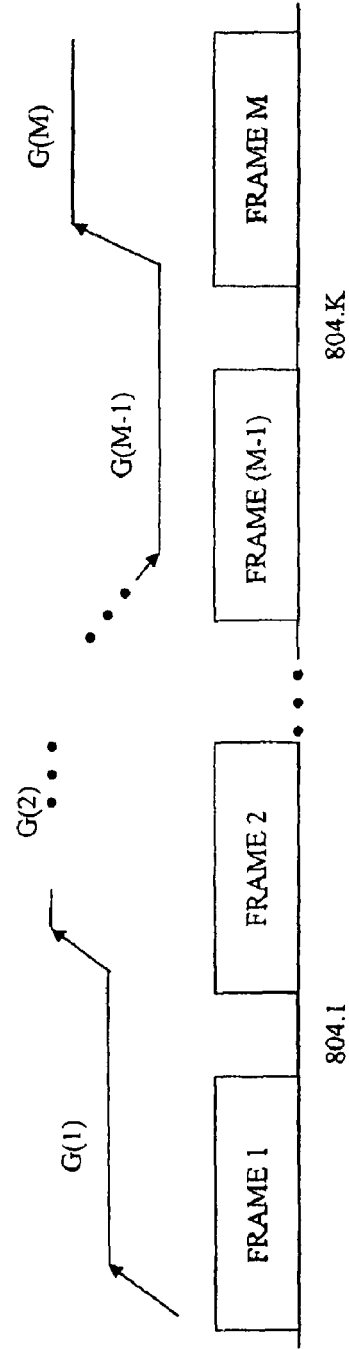
FIG. 8B illustrates a reconfiguration of a receiver gain by the communications receiver according to an exemplary embodiment of the present invention.

FIG. 8B illustrates a reconfiguration 850 of a receiver gain by the communications receiver according to an exemplary embodiment of the present invention. More specifically, reconfiguration 850 illustrates a communications receiver gains G(1) through G(M) superimposed on the transmitted communications signal 800.

After the communications receiver recovers the at least one information payload from the first frame 802, the communications receiver receives a preamble, such as the single stream preamble and/or the multiple stream preamble, embedded in the second frame 802. After recovering the preamble, the communications receiver configures the one or more reception parameters, such as communications receiver gains G(1) through G(M), to receive the at least one information payload embedded in the second frame 802 based on one or more reception parameters corresponding to the first frame 802. More specifically, the communications receiver determines a difference between the one or more reception parameters corresponding to the second frame 802 and the one or more reception parameters corresponding to the first frame 802. The communications receiver adjusts the one or more reception parameters from one or more first parameter values corresponding to the first frame 802 to one or more second parameter values corresponding to the second frame 804 by the difference between the one or more reception parameters corresponding to the second frame 802 and the one or more reception parameters corresponding to the first frame 802. For example, to adjust the receiver gain from a first receiver gain G(1) to a second receiver gain G(2), the communications receiver adjusts the receiver gain from the first receiver gain G(1) to the second receiver gain G(2). Likewise, to adjust a receiver gain from a (M−1)$^{th}$ receiver gain G(M−1) to a M$^{th}$ receiver gain G(M), the communications receiver adjusts the receiver gain from the (M−1)$^{th}$ receiver gain G(M−1) to the M$^{th}$ receiver gain G(M). In an exemplary embodiment, the communications receiver may configure the LNAs 404.1 through LNA 404.N and/or the VGAs 410.1 through 410.N from the first receiver gain G(1) to the second receiver gain G(2) using the first receiver gain G(1) as a starting point. However, this example is not limiting, the communications receiver may configure any suitable element having a gain that contributes to the receiver gain without departing from the spirit and scope of the present invention.

The communications receiver reduces a settling time of the one or more reception parameters as compared to the conventional communications receiver by configuring the one or more reception parameters corresponding to the second frame 802 based on the one or more reception parameters corresponding to the first frame 802. In other words, a duration of time required to reach the steady-state condition, namely a duration of time to configure the one or more reception parameters corresponding to the second frame 802 from the one or more reception parameters corresponding to the first frame 802, of the communication receiver is substantially less than a duration of time required to reach a steady-state condition for the conventional communications receiver. The reduction in settling time by the communications receiver allows the communications receiver to configure the one or more reception parameters from the one or more first parameter values to the one or more second parameter values to support RIFS. For example, the reduction in settling time by the communications receiver allows the communications receiver to adjust the receiver gain from a first receiver gain, such as the first receiver gain, G(1) to a second receiver gain, such as the second receiver gain G(2), such that the communications receiver may recover the at least one information payload embedded in the first frame 802 and/or may be configured to receive the at least one information payload embedded in the second frame 802 in the presence of RIFS.

Reconfiguration of Receiver Filters

Figure 9A:
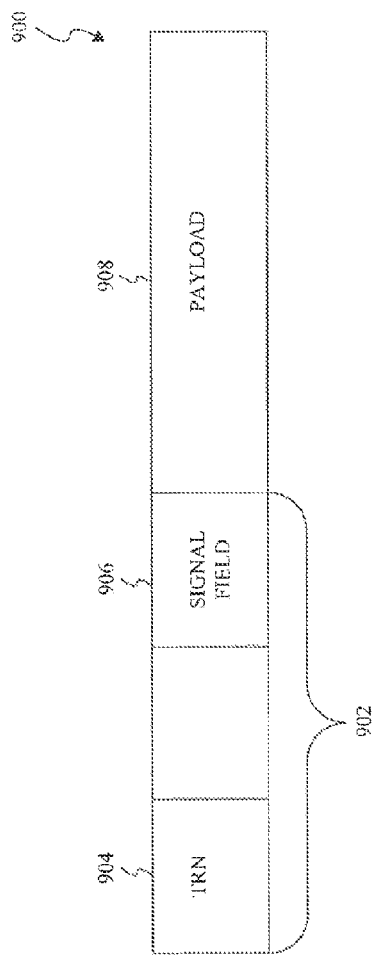
FIG. 9A illustrates communications packet according to the known communications standards.

FIG. 9A illustrates communications packet according to the known communications standards. A communications packet 900 may include a single stream communications packet in accordance with the known single stream communications standard and/or a multiple stream communications packet in accordance with the known multiple stream communications standard. The communications packet 900 may include at least one signal field such as, but not limited to, a preamble 902, a signal field 906, and/or a information payload 908 to provide some examples. However, this example is not limiting, those skilled in the relevant art(s) will recognize that the communications packet 900 may include a lesser number or a greater number of signal fields according to the communications standard without departing from the spirit and scope of the present invention.

The preamble 902 includes a training sequence 904 and a signal field 906. The training sequence 904 may be included at a start of the communications packet 900 to provide time synchronization for the baseband processing module 306 in accordance with the known single stream communications standard and/or the known multiple stream communications standard. The known single stream communications standard and/or the known multiple stream communications standard may provide for a short training sequence and/or a long training sequence. A communication receiver, such as the communications receiver 106 to provide an example, may use the short training sequence for, but not limited to, signal detection, automatic gain control, diversity selection, coarse frequency offset estimation and/or timing synchronization to provide some examples. Likewise, the communication receiver may use the long training sequence for, but not limited to, communication channel estimation and/or fine frequency offset estimation to provide some examples.

The signal field 906 determines characteristics of the information payload 908. The signal field 906 may indicate the information relating to modulation of the information payload 908. For example, the signal field 906 may convey information about the type of modulation of the information payload 908, a coding rate of the information payload 908, a length of the information payload 908, or any other suitable characteristic of the information payload 908.

The communications transmitter may further encode the communications packet 900 according to the known single stream communications standard and/or the known multiple stream communications standard for transmission to the communication receiver over a communications channel, such as the communications channel 104 to provide an example. For example, the known single stream communications standard and/or the known multiple stream communications standard, such as the IEEE 802.11n™ standard to provide an example, may orthogonal frequency division multiplex (OFDM) the communications packet 900 for transmission to the communication receiver over the communications channel.

Orthogonal frequency division multiplexing (OFDM) is a digital multi-carrier scheme that uses multiple orthogonal sub-carriers spaced apart at different frequencies. Each sub-carrier may be modulated using any one of a number of modulation schemes, such as binary phase-shift keying (BPSK), quadrature PSK (QPSK), 16-level quadrature amplitude modulation (16-QAM), or 64-level QAM (64-QAM) to provide some examples, at a low symbol rate.

The known single stream communications standard and/or the known multiple stream communications standard for transmission encodes the communications packet 900 onto one or more sub-carriers. For example, the IEEE 802.11a™ standard encodes the communications packet 900 onto sub-carrier −26 through sub-carrier 26. As another example, the IEEE 802.11n™ standard encodes the communications packet 900 onto sub-carrier −28 through sub-carrier 28. A number of carriers used to encode the training sequence 904 is substantially less than a number of carriers used to encode the information payload 908. For example, the known single stream communications standard and/or the known multiple stream communications standard encodes the information payload 908 substantially beginning or starting at or near sub-carrier 1 and/or sub-carrier −1, whereas the known single stream communications standard and/or the known multiple stream communications standard encodes the training sequence 904 substantially beginning or starting at or near sub-carrier 4 and/or sub-carrier −4. However, this example is not limiting, those skilled in the relevant art(s) will recognize that the communications transmitter may encode the communications packet 900 according to any suitable known communication standard for transmission to the communication receiver over the communications channel without departing from the spirit and scope of the present invention.

Figure 9B:
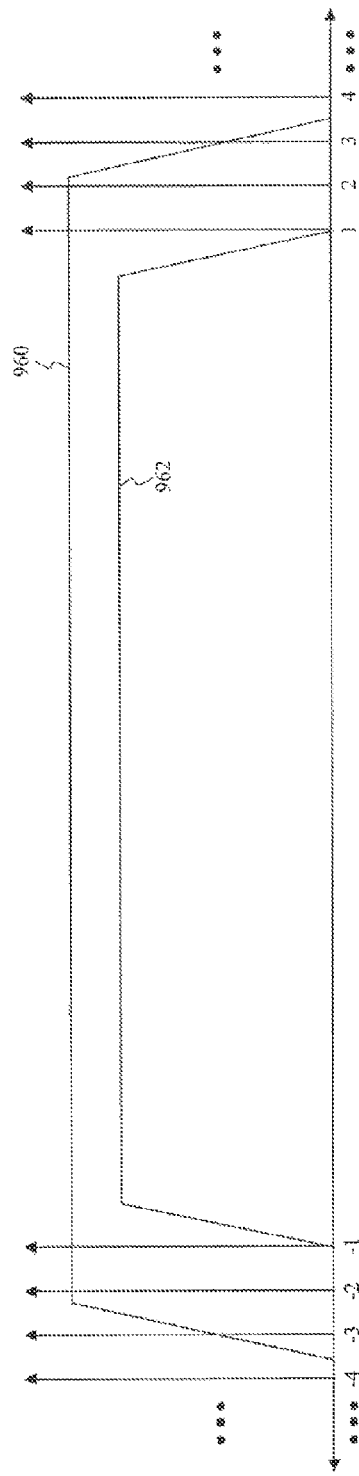
FIG. 9B illustrates a frequency domain representation of a variable lowpass filter according to an exemplary embodiment of the present invention.

FIG. 9B illustrates a frequency domain representation of a variable lowpass filter according to an exemplary embodiment of the present invention. The frequency domain representation of the variable lowpass filter may represent an exemplary embodiment of a frequency domain representation of one or more of the first variable low pass filters 506.1 through 506.N, and/or one or more of the second variable low pass filters 510.1 through 510.N to provide some examples as discussed in FIG. 5.

The variable lowpass filter may include a variable filter training sequence bandwidth 960 and/or a variable filter information payload bandwidth 962. However, this example is not limiting, those skilled in the relevant art(s) will recognize that the variable lowpass filter may include any suitable number of variable lowpass filter bandwidths as provided by the known single stream communications standard and/or the known multiple stream communications standard without departing from the spirit and scope of the present invention. Those skilled in the relevant art(s) will recognize that magnitudes and/or frequency characteristics of the variable filter training sequence bandwidth 960 and/or the variable filter information payload bandwidth 962 as shown in FIG. 9B are for demonstrative purposes only.

The variable lowpass filter may dynamically select the variable filter training sequence bandwidth 960 if the communications packet 900 corresponds to at least the training sequence 904. The variable filter training sequence bandwidth 960 substantially attenuates those sub-carriers allocated to the training sequence 904. For example, the variable filter training sequence bandwidth 960 does not substantially attenuate sub-carrier 1 through sub-carrier 3 and/or sub-carrier −1 through sub-carrier −3 and substantially attenuates the sub-carriers substantially greater than sub-carrier 3 and/or less than sub-carrier −3. Likewise, the variable lowpass filter may dynamically select the variable filter information payload bandwidth 962 if the communications packet 900 corresponds to at least the information payload 908. The variable filter information payload bandwidth 962 substantially attenuates those sub-carriers allocated to the information payload 908. For example, the variable filter information payload bandwidth 962 substantially attenuates all of the sub-carriers.

Figure 9C:
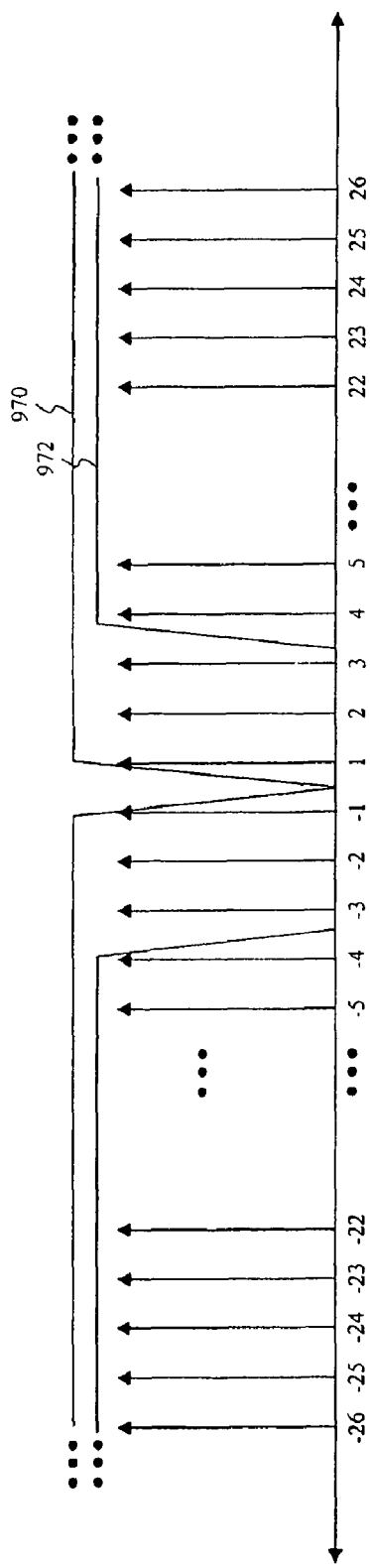
FIG. 9C illustrates a frequency domain representation of a combination of a combination module and the variable low pass filter according to an exemplary embodiment of the present invention.

FIG. 9C illustrates a frequency domain representation of a combination of a combination module and the variable low pass filter according to an exemplary embodiment of the present invention. A frequency response of the combination of the combination module, such as the first combination module 504.1 and/or second combination module 508.1 to provide some examples, and the variable low pass filter may approximate a high pass filter. In other words, the combination module subtracts spectral components not substantially attenuated by the variable filter training sequence bandwidth 960 and/or the variable filter information payload bandwidth 962 from the communications packet 900 to in effect high pass filter the communications packet 900.

The variable lowpass filter may dynamically select the variable filter training sequence bandwidth 960 if the communications packet 900 corresponds to at least the training sequence 904. The combination module subtracts spectral components not substantially attenuated by the variable filter training sequence bandwidth 960 to produce a high pass filter having a variable filter training sequence bandwidth 972. As a result, the variable filter training sequence bandwidth 972 does not substantially attenuate those sub-carriers allocated to the training sequence 904. For example, the variable filter training sequence bandwidth 972 substantially attenuates sub-carrier 1 through sub-carrier 3 and/or sub-carrier −1 through sub-carrier −3 and does not attenuate the sub-carriers substantially greater than sub-carrier 3 and/or sub-carrier −3. Likewise, the variable lowpass filter may dynamically select the variable filter information payload bandwidth 962 if the communications packet 900 corresponds to at least the information payload 908. The combination module subtracts spectral components not substantially attenuated by the information payload 908 to produce a high pass filter having a variable filter information payload bandwidth 970. As a result, the variable filter information payload bandwidth 970 does not substantially attenuate those sub-carriers allocated to the information payload 908. For example, the variable filter information payload bandwidth 970 does not attenuate any of the sub-carriers.

Figure 10A:
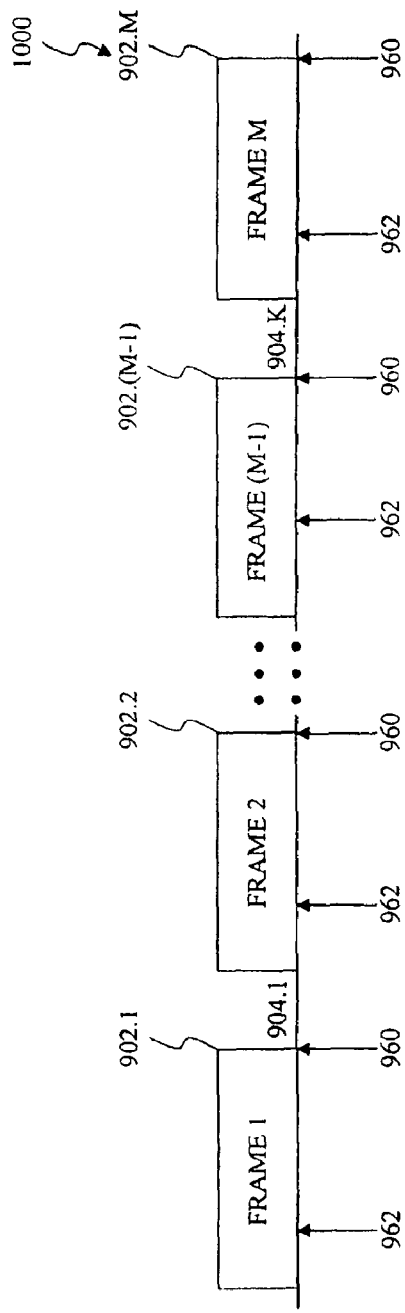
FIG. 10A illustrates a reconfiguration of one or more variable low pass filters by the communications receiver according to an exemplary embodiment of the present invention.

FIG. 10A illustrates a reconfiguration 1000 of one or more variable low pass filters by the communications receiver according to an exemplary embodiment of the present invention. A communications receiver, such as the communications receiver 106 to provide an example, receives a transmitted communications signal, such as the communications packet 900, as it passes through a communication channel, such as the communication channel 104 to provide an example. The communications receiver may recover at least one first information payload, such as at least one information payload embedded in at least one of the recovered information signals 156.1 through 156.K and/or the recovered information signals 166.1 through 166.K to provide some examples, from a first corresponding one of one or more frames 902.1 through 902.M, herein referred to as a first frame 902, during a corresponding one of the interframe spacers 904.1 through 904.K and/or may configure one or more reception parameters to receive at least one second information payload, embedded in a second corresponding one of one or more frames 902.1 through 902.M, herein referred to as a second frame 902. For example, the communications receiver may recover the first information payload from the frame 902.1 during the interframe spacer 904.1 and/or may configure one or more reception parameters to receive the second information payload from the second frame 902.2.

The communications receiver may configure a variable low pass filter bandwidth of the one or more variable low pass filters to the variable filter training sequence bandwidth 960 during the first frame 902. As a result, the first frame 902 is filtered according to the variable filter training sequence bandwidth 972. The variable filter training sequence bandwidth 960 may used be to recover at least the training sequence, such as a single stream training sequence and/or a multiple stream training sequence to provide some examples, embedded in the first frame 902. Alternatively, the variable filter training sequence bandwidth 960 may be used during the recovery of the preamble, such as the single stream preamble and/or the multiple stream preamble to provide some examples, embedded in the first frame 902.

The communications receiver may configure the one or more reception parameters based on the at least one training sequence. After the one more reception parameters have settled to the steady-state condition, the communications receiver may configure the bandwidth of the one or more variable low pass filters to the variable filter information payload bandwidth 962. Alternatively, the communications receiver may configure the bandwidth of the one or more variable low pass filters to the variable filter information payload bandwidth 962 after recovery of at least the preamble. As a result, the first frame 902 is filtered according to the variable filter information payload bandwidth 970. For example, the one or more variable low pass filters may select the variable filter training sequence bandwidth 960 while a communications receiver gain is adjusted from a first receiver gain, such as the receiver gain G(1) to provide an example, to a second receiver gain, such as the receiver gain G(2) to provide example.

The one or more variable low pass filters may select the variable filter information payload bandwidth 962 after the communications receiver gain substantially reaches a steady-state value for the second receiver gain. The variable filter information payload bandwidth 962 may be used to the recover the at least one information payload from the single stream information payload and/or the multiple stream information payload. After the communications receiver recovers the at least one information payload from the first frame 902, the communications receiver may configure the bandwidth of the one or more variable low pass filters to the variable filter training sequence bandwidth 960 to receive the second frame 902.

A conventional communications receiver does not typically include the variable low pass filter. At most, the conventional communications receiver may include a high pass filter having a single or individual conventional receiver filter bandwidth. The individual conventional receiver filter bandwidth exhibits a substantially slower settling time as compared to the variable filter training sequence bandwidth 972. In other words, when the conventional communications configures one or more conventional reception parameters, a larger or greater settling of time is necessary for the one or more conventional reception parameters to reach the steady-state condition as compared to the communications receiver. As a result of the larger settling of time, the conventional communications receiver is unable to support RIFS.

Figure 10B:
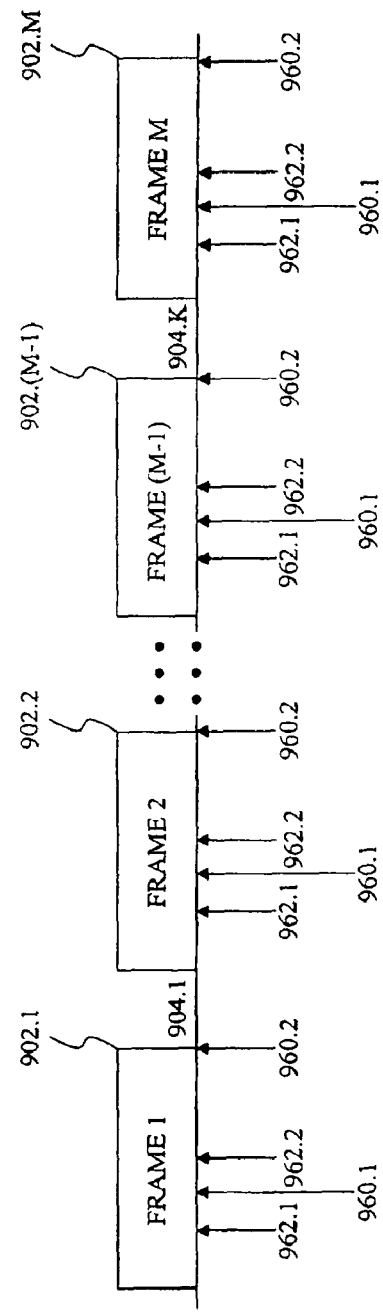
FIG. 10B illustrates a reconfiguration of one or more variable low pass filters by the communications receiver according to another exemplary embodiment of the present invention.

FIG. 10B illustrates a reconfiguration 1050 of one or more variable low pass filters by the communications receiver according to another exemplary embodiment of the present invention. The reconfiguration 1050 is substantially similar to the reconfiguration 1000, thus only differences between reconfiguration 1000 and the reconfiguration 1050 will discussed in further detail.

The communications receiver may configure a variable low pass filter bandwidth of the one or more variable low pass filters to the variable filter training sequence bandwidth 960.1 during the first frame 902. The communications receiver may configure the one or more reception parameters more than once based on the at least one training sequence. For example, a high through put automatic gain control (HTAGC) mode of operation in accordance with the known multiple stream communications standard may configure the communications receiver gain more then once after recovering the short training sequence.

After the one more reception parameters have settled to the steady-state condition, the communications receiver may configure the bandwidth of the one or more variable low pass filters to the variable filter information payload bandwidth 962.1. The communications may once again configure the variable low pass filter to the variable filter training sequence bandwidth 960.2 to again configure the one or more reception parameters based on the at least one training sequence. After the one more reception parameters have settled to the steady-state condition, the communications receiver may configure the bandwidth of the one or more variable low pass filters to the variable filter information payload bandwidth 962.2.

The variable filter information payload bandwidth 962 may be used to the recover the at least one information payload from the single stream information payload and/or the multiple stream information payload. After the communications receiver recovers the at least one information payload from the first frame 902, the communications receiver may configure the bandwidth of the one or more variable low pass filters to the variable filter training sequence bandwidth 960.1 to receive the second frame 902. However, this example is not limiting, those skilled in the relevant art(s) will recognize that the communications receiver may configure the one or more reception parameters more than once by switching between the variable filter training sequence bandwidth 960 and the variable filter information payload bandwidth 962 without departing from the spirit and scope of the present invention.

Exemplary Operation of the Communications Environments

Figure 11:
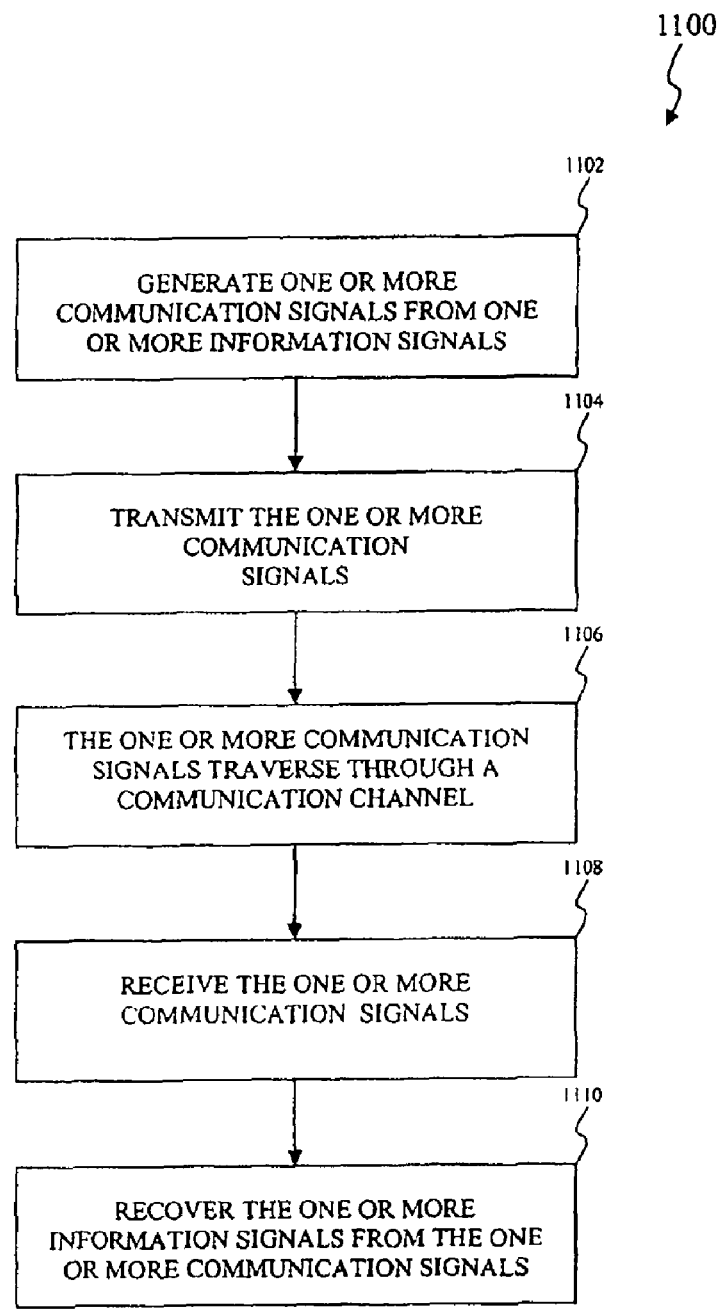
FIG. 11 is a flowchart of exemplary operational steps of a communications environment according to an aspect of the present invention.

FIG. 11 is a flowchart 1100 of exemplary operational steps of a communications environment according to an aspect of the present invention. The invention is not limited to this operational description. Rather, it will be apparent to persons skilled in the relevant art(s) from the teachings herein that other operational control flows are within the scope and spirit of the present invention. The following discussion describes the steps in FIG. 11.

At step 1102, one or more communications signals, such as the transmitted communications signal 152 and/or the transmitted communications signal 162.1 through 162.1, are generated from one or more information signals as received from one or more transmitter user devices, such as the information signals 150.1 through 150.K and/or the information signals 160.1 through 160.K. More specifically, the one or more information signals are encoded according to a known single stream communications standard, such as, but not limited to, the IEEE 802.11a™ standard, the IEEE 802.11b™ standard, the IEEE 802.11g™ standard, and/or any other suitable single stream communications standard and/or a known multiple stream communications standard, such as, but not limited to, the IEEE 802.11n™ standard, and/or any other suitable multiple stream communications standard to produce the one or more communications signals.

The one or more communications signals includes one or more frames, such as the frames 602.1 through 602.M the frames 802.1 through 802.M and/or the frames 902.1 through 902.M to provide some examples. The one or more frames 602.1 through 602.M may include one or more data packets of fixed or variable length. Each one of the one or more frames may further include at least one single stream signal field such as, a single stream preamble, a single stream signal field, and/or a single stream single stream information payload and/or at least one multiple stream signal field such as, a multiple stream preamble, a multiple stream signal field, and/ or a multiple stream information payload. The one or more communications signals may include one or more interframe spacers, such as the interframe spacers 604.1 through 604.M, the interframe spacers 804.1 through 804.M, and/or the interframe spacers 904.1 through 904.M to provide some examples, corresponding to the one or more frames. More specifically, the one or more frames may be separated by a corresponding interframe spacer according to the known single stream communications standard and/or the known multiple stream communications standard. For example, the known single stream communications standard and/or the known multiple stream communications standard may provide for a reduced interframe spacing (RIFS) duration of approximately 2 µs and/or a short interframe spacing (SIFS) duration of approximately 10 µs.

At step 1104, the one or more frames of the one or more communications signals from step 1102 are transmitted as a single stream communications signal according to the known single stream communications standard to produce the one or more communications signals from step 1102 Alternatively, the one or more frames of the one or more communications signals from step 1102 are transmitted as a multiple stream communications signal according to the known multiple stream communications standard.

At step 1106, the one or more frames of the one or more communications signals from step 1104 traverse through a communication channel, such as the communication channel 104. The communication channel may include, but is not limited to, a microwave radio link, a satellite channel, a fiber optic cable, a hybrid fiber optic cable system, or a copper cable to provide some examples. The communication channel contains a propagation medium that the one or more communications signals from step 1104 pass through before reception. The propagation medium of the communication channel introduces interference and/or distortion into the communications signal. For example, noise such as, but not limited to, thermal noise, burst noise, impulse noise, interference, signal strength variations known as fading, phase shift variations, to provide some examples, may introduce interference and/or distortion into the communications signal. In addition, the propagation medium of the communication channel may cause the one or more communications signals to propagate onto multiple communication paths, reflecting from different objects, surface areas, surface boundaries, and interfaces in the communications environment. Potential causes of multipath propagation may include, but are not limited to, atmospheric ducting, ionospheric reflection and/or refraction, and/ or reflection from terrestrial objects such as mountains and/or buildings to provide some examples.

At step 1108, the one or more communications signals from step 1106 are received. The one or more communications signals from step 1106 are received as either a single stream communications signal and/or a multiple stream communications signal. The multiple communication paths traversed by the one or more communications signals from step 1106 resulting from the multipath propagation introduced by the communication channel may be received. For example, the multiple communication paths of the one or more communications signals from step 1106 transmitted as the single stream communications signal may be received as it traverses through the communication channel. Likewise, the multiple communication paths of the one or more communications signals from step 1106 transmitted as the multiple stream communications signal may be received as it traverses through the communication channel.

At step 1110, one or more information signals, such as the recovered information signals 156.1 through 156.K and/or the recovered information signals 166.1 through 166.K to provide some examples, are recovered from the one or more frames of the one or more communications signals from step 1108 to produce one or more recovered information signals. The one or more communications signals from step 1108 are operated upon according to the known single stream communications standard and/or the known multiple stream communications standard to recover the one or more information signals.

Exemplary Operation of the Communications Receiver

Figure 12:
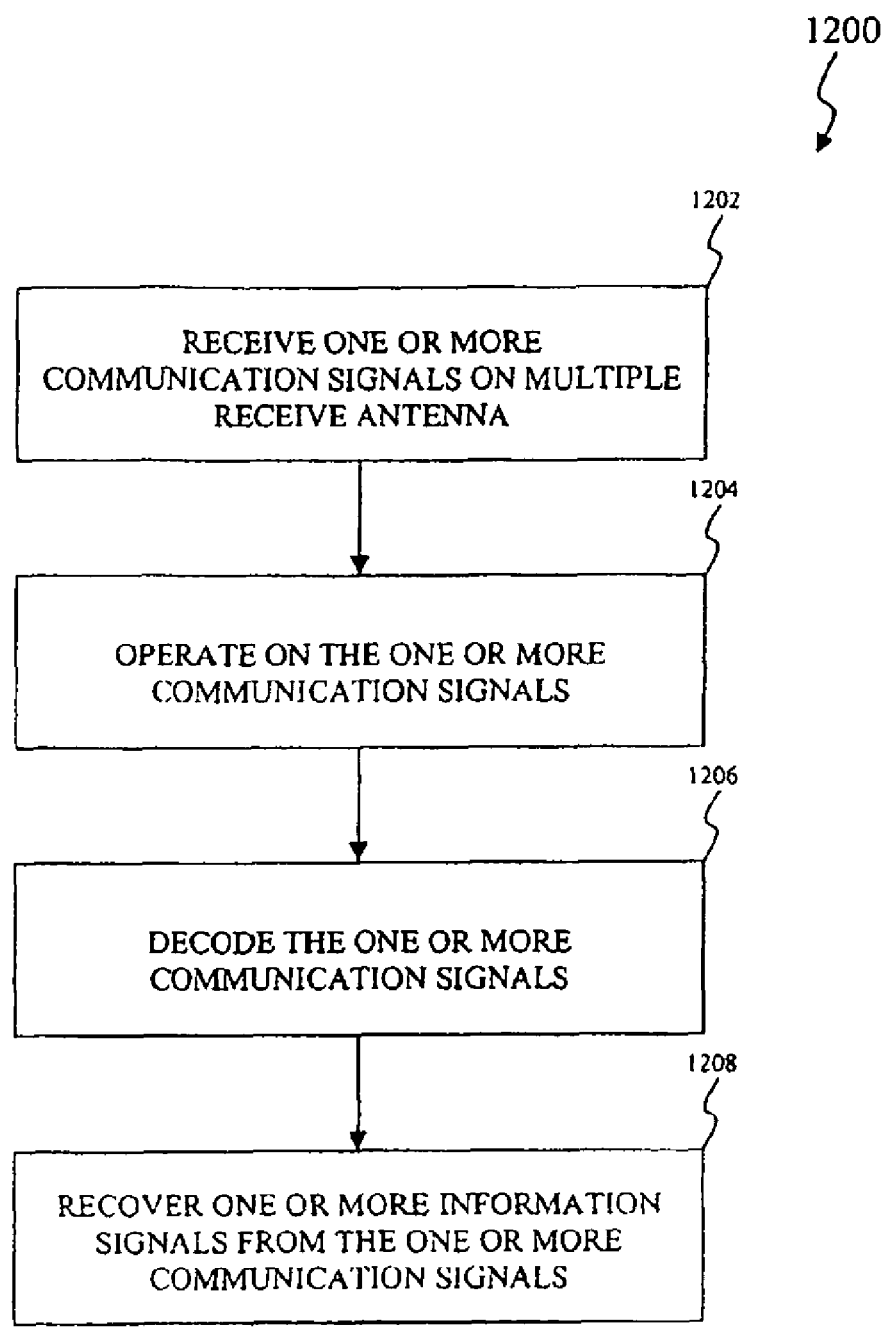
FIG. 12 is a flowchart of exemplary operational steps of a communications receiver according to an aspect of the present invention.

FIG. 12 is a flowchart 1200 of exemplary operational steps of a communications receiver according to an aspect of the present invention. In other words, FIG. 12 further defines steps 1108 and 1110 as shown in FIG. 11. The invention is not limited to this operational description. Rather, it will be apparent to persons skilled in the relevant art(s) from the teachings herein that other operational control flows are within the scope and spirit of the present invention. The following discussion describes the steps in FIG. 12.

At step 1202, one or more frames of one or more communications signals, such the received communications signals 154.1 through 154.N and/or the received communications signals 164.1 through 164.N to provide some examples, are received to produce one or more received communications signals, such as the received communications signals 250.1 through 250.N to provide some examples. More specifically, the one or more frames of the one or more communications signals are received as they traverse through a communication channel, such as the communication channel 104. The one or more frames of the one or more communications signals may include one or more single stream communications signals, one or more multiple stream communications signals, and/or any combination thereof.

At step 1204, the one or more frames of one or more communications signals from step 1202 are operated on to produce one or more downconverted communications signals, such as the downconverted communications signals 252.1 through 252.N to provide an example. For example, the one or more communications signals from step 1202 may be downconverted to baseband or any suitable intermediate frequency (IF) to produce the downconverted communications signals. However, those skilled in the relevant art(s) will recognize that step 1204 is optional, the operational control may flow directly from step 1202 to step 1206 for a baseband and/or a near baseband communication.

At step 1206, the one or more communications signals from step 1204 are decoded to produce one or more decoded communications signals, such as the decoded communications signals 254.1 through 254.M to provide an example. Alternatively, the one or more communications signals from step 1202 may be directly decoded to produce the one or more decoded communications signals. More specifically, the one or more communications signals from step 1202 and/or the one or more communications signals from step 1204 are decoded to produce the one or more decoded communications signals according to the known single stream communications standard and/or the known multiple stream communications standard. If the one or more communications signals from step 1202 and/or the one or more communications signals from step 1204 includes the single stream communications signal, the one or more communications signals from step 1202 and/or the one or more communications signals from step 1204 are decoded according to the known single stream communications standard. If the one or more communications signals from step 1202 and/or the one or more communications signals from step 1204 includes the multiple stream communications signal, the one or more communications signals from step 1202 and/or the one or more communications signals from step 1204 are decoded according to the known multiple stream communications standard.

At step 1208, one or more information signals, such as the recovered information signals 256.1 through 256.K to provide an example, are recovered by operating on the communications signal from step 1206 according to the known single stream communications standard and/or the known multiple stream communications standard.

Exemplary Operation of the Physical Layer Interface

Figure 13:
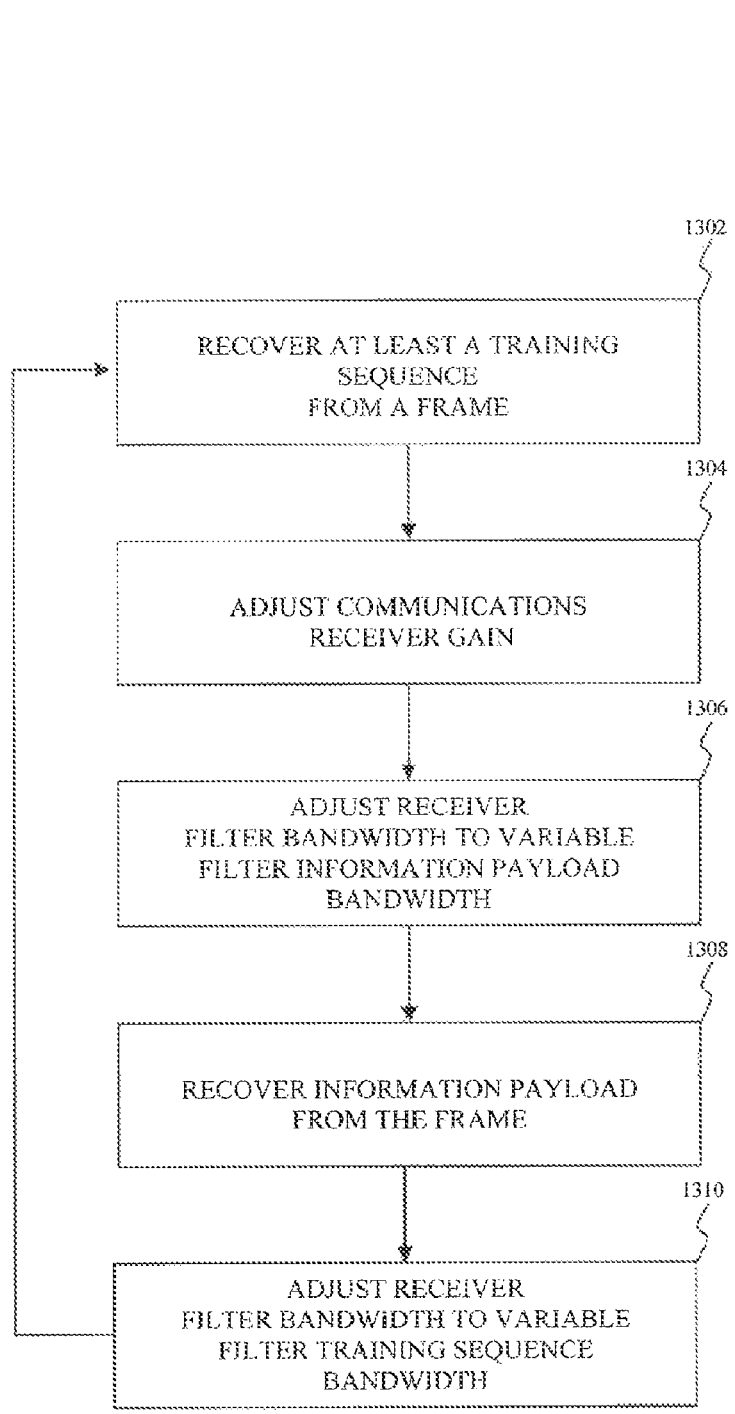
FIG. 13 is a flowchart of exemplary operational steps to configure the communications receiver according to an aspect of the present invention.

FIG. 13 is a flowchart 1300 of exemplary operational steps to configure the communications receiver according to an aspect of the present invention. In other words, FIG. 13 further defines step 1206 as shown in FIG. 12. The invention is not limited to this operational description. The invention is not limited to this operational description. Rather, it will be apparent to persons skilled in the relevant art(s) from the teachings herein that other operational control flows are within the scope and spirit of the present invention. The following discussion describes the steps in FIG. 13.

At step 1302, at least a training sequence, such the single stream training sequence and/or the multiple stream training sequence to provide some examples, embedded in a frame is recovered using a variable filter training sequence bandwidth, such as the variable filter training sequence bandwidth 960 to provide an example. Alternatively, a preamble, such the single stream preamble and/or the multiple stream preamble to provide some examples, embedded in the frame is recovered using the variable filter training sequence bandwidth. The training sequence may be recovered according to the known single stream communications standard and/or the known multiple stream communications standard.

At step 1304, a communications receiver gain is configured from a previous communications receiver gain to a current communications receiver gain. More specifically, an amount of gain necessary to recover an information payload embedded in the frame is determined based on the recovered preamble in step 1302. A difference between the amount of gain necessary to recover the information payload and the previous communications receiver gain is determined. The previous communications receiver gain is adjusted by the difference between the amount of gain necessary to recover the information payload and the previous communications receiver gain to produce the communications receiver gain.

At step 1306, a receiver filter bandwidth is adjusted from the variable filter training sequence bandwidth of step 1302 to a variable filter information payload bandwidth, such as the variable filter information payload bandwidth 962 to provide some examples. The receiver filter bandwidth is adjusted from the variable filter training sequence bandwidth of step 1304 to the variable filter information payload bandwidth substantially simultaneous with a settling of the communications receiver gain from step 1304 to a steady-state condition.

At step 1308, an information payload, such as the recovered information signals 256.1 through 256.K, embedded in the frame is recovered using the settled filter bandwidth from step 1306. The information payload is recovered by operating on the information payload embedded in the frame according to the known single stream communications standard and/or the known multiple stream communications standard.

At step 1310, a receiver filter bandwidth is adjusted from the variable filter information payload bandwidth of step 1306 to the variable filter training sequence bandwidth of step 1302. The receiver filter bandwidth is adjusted from the variable filter information payload bandwidth of step 1306 to the variable filter training sequence bandwidth of step 1302 substantially before, substantially after, and/or substantially simultaneously with recovering the information payload in step 1308.

The operational control flow reverts back to step 1302 to process another frame.

CONCLUSION

While various embodiments of the present invention have been described above, it should be understood that they have been presented by way of example and not limitation. It will be apparent to one skilled in the pertinent art that various changes in form and detail can be made therein without departing from the spirit and scope of the invention. Therefore, the present invention should only be defined in accordance with the following claims and their equivalents.

What is claimed is:

1. A method for recovering an information payload embedded in one or more communication signals by a communications receiver, the one or more communication signals including a plurality of frames separated by a corresponding interframe spacer from among a plurality of interframe spacers, comprising:
   (A) recovering a training sequence embedded in a frame from among the plurality of frames using a variable filter training sequence bandwidth;
   (B) adjusting a reception parameter based on a previous reception parameter;
   (C) adjusting a receiver filter bandwidth from the variable filter training sequence bandwidth to a variable filter information payload bandwidth when the reception parameter has substantially settled to a steady-state condition;
   (D) recovering an information payload embedded in the frame using the variable filter information payload bandwidth before a duration of the corresponding interframe spacer lapses; and
   (E) adjusting the receiver filter bandwidth from the variable filter information payload bandwidth to the variable filter training sequence bandwidth.

2. The method of claim 1, wherein step (A) comprises:
   (A)(i) recovering the training sequence embedded in the frame in accordance with at least one selected from a group consisting of:
   a known single stream communications standard; and
   a known multiple stream communications standard.

3. The method of claim 2, wherein step (A)(i) comprises:
   (A)(i)(1) recovering the training sequence embedded in the frame in accordance with at least one selected from a group consisting of:
   an Institute of Electrical and Electronics Engineers (IEEE) 802.11a™ standard;
   an IEEE 802.11b™ standard;
   an IEEE 802.11g™ standard; and
   an IEEE 802.11n™ standard.

4. The method of claim 1, wherein step (A) comprises:
   (A)(i) recovering a preamble embedded in the frame using the variable filter training sequence bandwidth.

5. The method of claim 4, wherein step (A)(i) comprises:
   (A)(i)(1) recovering at least one selected from a group consisting of a single stream preamble and a multiple stream preamble embedded in the frame using the variable filter training sequence bandwidth.

6. The method of claim 4, wherein step (A)(i) comprises:
   (A)(i)(1) recovering the preamble embedded in the frame in accordance with at least one selected from a group consisting of:
   a known single stream communications standard; and
   a known multiple stream communications standard.

7. The method of claim 1, wherein step (A)(i)(1) comprises:
   (A)(i)(1)(a) recovering the preamble embedded in the frame in accordance with at least one selected from a group consisting of:
   an Institute of Electrical and Electronics Engineers (IEEE) 802.11a™ standard;
   an IEEE 802.11b™ standard;
   an IEEE 802.11g™ standard; and
   an IEEE 802.11n™ standard.

8. The method of claim 1, wherein step (A) comprises:
   (A)(i) recovering at least one of a single stream training sequence and a multiple stream training sequence embedded in the frame using the variable filter training sequence bandwidth.

9. The method of claim 1, wherein step (B) comprises:
   (B)(i) adjusting a communications receiver gain based on a previous communications receiver gain.

10. The method of claim 9, wherein step (B)(i) comprises:
    (B)(i)(1) determining an amount of gain necessary to recover the information payload based on the training sequence;
    (B)(i)(2) determining a difference between the amount of gain necessary to recover the information payload and the previous communications receiver gain; and
    (B)(i)(3) adjusting the previous communications receiver gain by the difference between the amount of gain necessary to recover the information payload and the previous communications receiver gain.

11. The method of claim 9, wherein step (C) comprises:
    (C)(i) adjusting a receiver filter bandwidth from the variable filter training sequence bandwidth to a variable filter information payload bandwidth when the communications receiver gain has substantially settled to the steady-state condition.

12. The method of claim 1, wherein step (D) comprises:
    (D)(i) recovering the payload embedded in the frame in accordance with at least one selected from a group consisting of:
    a known single stream communications standard; and
    a known multiple stream communications standard.

13. The method of claim 1, wherein step (D)(i) comprises:
    (D)(i)(1) recovering the payload embedded in the frame in accordance with at least one selected from a group consisting of:
    an Institute of Electrical and Electronics Engineers (IEEE) 802.11a™ standard;
    an IEEE 802.11b™ standard;
    an IEEE 802.11g™ standard; and
    an IEEE 802.11n™ standard.

14. The method of claim 1, wherein step (D) comprises:
    (D)(i) recovering the payload embedded in the frame substantially before a duration of a reduced interframe spacer (RIFS) lapses.

15. A communications receiver for recovering an information payload embedded in one or more communication signals, the one or more communication signals including a plurality of frames separated by a corresponding interframe spacer from among a plurality of interframe spacers, comprising:
    a radio receiver configured to operate upon the one or more communication signals using a reception parameter to recover a frame from among the plurality of frames;
    a physical layer interface (PHY) receiver filter configured to operate upon the frame using a PHY receiver filter bandwidth;

one or more baseband processing modules configured to recover a training sequence and an information payload embedded in the frame before a duration of the corresponding interframe spacer lapses, wherein the one or more baseband processing modules are configured to adjust the reception parameter based on a previous reception parameter before recovering the information payload, and wherein the PHY receiver filter bandwidth is configurable to be adjusted to a variable filter training sequence bandwidth before recovering the training sequence and to be adjusted to a variable filter information payload bandwidth before recovering the information payload.

16. The communications receiver of claim 15, wherein the one or more baseband processing modules are further configured to recover the training sequence in accordance with at least one selected from a group consisting of:
    a known single stream communications standard; and
    a known multiple stream communications standard.

17. The communications receiver of claim 16, wherein the one or more baseband processing modules are further configured to recover the training sequence in accordance with at least one selected from a group consisting of:
    an Institute of Electrical and Electronics Engineers (IEEE) 802.11a™ standard;
    an IEEE 802.11b™ standard;
    an IEEE 802.11g™ standard; and
    an IEEE 802.11n™ standard.

18. The communications receiver of claim 15, wherein the training sequence includes a preamble.

19. The communications receiver of claim 18, wherein the preamble includes at least one selected from a group consisting of:
    a single stream preamble; and
    a multiple stream preamble.

20. The communications receiver of claim 15, wherein the reception parameter includes a communications receiver gain.

21. The communications receiver of claim 20, wherein the radio receiver is further configured to amplify the frame based on the communications receiver gain.

22. The communications receiver of claim 20, wherein the one or more baseband processing modules are configured to adjust the communications receiver gain by determining an amount of gain necessary to recover the information payload based on the training sequence, to determine a difference between the amount of gain necessary to recover the information payload and the previous communications receiver gain, and to adjust the previous communications receiver gain by the difference between the amount of gain necessary to recover the information payload and the previous communications receiver gain.

23. The communications receiver of claim 20, wherein the PHY receiver filter bandwidth is further configurable to be adjusted when the communications receiver gain has substantially settled to a steady-state condition.

24. The communications receiver of claim 15, wherein the one or more baseband processing modules are further configured to recover the information payload in accordance with at least one selected from a group consisting of:
    a known single stream communications standard; and
    a known multiple stream communications standard.

25. The communications receiver of claim 15, wherein the one or more baseband processing modules are further configured to recover the information payload more frames in accordance with at least one selected from a group consisting of:
    an Institute of Electrical and Electronics Engineers (IEEE) 802.11a™ standard;
    an IEEE 802.11b™ standard;
    an IEEE 802.11g™ standard; and
    an IEEE 802.11n™ standard.

26. The communications receiver of claim 15, wherein the one or more baseband processing modules are further configured to recover the training sequence embedded and the information payload substantially before a duration of a reduced interframe spacer (RIFS) lapses.

27. The communications receiver of claim 15, wherein the radio receiver comprises:
    a radio receiver filter configured to operate upon the frame using a radio receiver filter bandwidth,
    wherein the radio receiver filter bandwidth is configurable to be adjusted to the variable filter training sequence bandwidth before recovering the training sequence and to be adjusted to the variable filter information payload bandwidth before recovering the information payload.

* * * * *

UNITED STATES PATENT AND TRADEMARK OFFICE
CERTIFICATE OF CORRECTION

| | | |
|---|---|---|
| PATENT NO. | : 8,116,408 B2 | Page 1 of 1 |
| APPLICATION NO. | : 12/213179 | |
| DATED | : February 14, 2012 | |
| INVENTOR(S) | : Rohit V. Gaikwad | |

It is certified that error appears in the above-identified patent and that said Letters Patent is hereby corrected as shown below:

At column 26, line 1, please replace "claim 1" with --claim 6--.

At column 28, lines 21-22, please replace "payload more frames in accordance" with --payload in accordance--.

Signed and Sealed this
Twenty-fourth Day of April, 2012

David J. Kappos
*Director of the United States Patent and Trademark Office*